United States Patent
Behrens et al.

(10) Patent No.: US 6,609,034 B1
(45) Date of Patent: Aug. 19, 2003

(54) SYSTEM AND METHOD FOR REMOTELY CONTROLLING AND MONITORING A PLURALITY OF COMPUTER SYSTEMS

(75) Inventors: Edward Behrens, Laguna Niguel, CA (US); Tho Tu, Laguna Niguel, CA (US); Van Hua, San Jose, CA (US); David Wang, San Jose, CA (US); John Goodin, Coto de Caza, CA (US); Robert Matthes, San Clemente, CA (US)

(73) Assignee: Epicenter, Incorporated, San Jose, CA (US)

(*) Notice: Subject to any disclaimer, the term of this patent is extended or adjusted under 35 U.S.C. 154(b) by 0 days.

(21) Appl. No.: 09/538,063

(22) Filed: Mar. 29, 2000

(51) Int. Cl.[7] ............................................. G05B 15/00
(52) U.S. Cl. .............................. 700/19; 700/17; 700/83; 700/20; 700/1; 710/303; 710/304; 710/305; 361/681; 361/682; 361/683; 709/200; 709/201
(58) Field of Search ............................... 700/1, 2, 3, 4, 700/5, 65, 66, 17, 83; 709/200, 201, 212, 213, 217, 220, 223–226, 249, 250, 253; 710/303, 304, 305, 600–602; 361/681, 682, 683, 724–725, 816; 312/223.1, 223.2, 223.3, 223.4

(56) References Cited

U.S. PATENT DOCUMENTS

| | | | | |
|---|---|---|---|---|
| 5,067,071 A | * | 11/1991 | Schanin et al. | 710/113 |
| 5,388,032 A | * | 2/1995 | Gill et al. | 361/680 |
| 5,499,377 A | | 3/1996 | Lee | |
| 5,673,170 A | * | 9/1997 | Register | 248/923 |
| 5,721,842 A | | 2/1998 | Beasley | |
| 5,726,866 A | * | 3/1998 | Allen | 361/683 |
| 5,732,212 A | | 3/1998 | Perholtz | |
| 5,878,248 A | * | 3/1999 | Tehranian et al. | 345/502 |
| 5,884,096 A | | 3/1999 | Beasley | |
| 5,913,034 A | | 6/1999 | Malcolm | |
| 5,926,364 A | | 7/1999 | Karidis | |
| 5,937,176 A | | 8/1999 | Beasley | |
| 5,949,643 A | | 9/1999 | Batio | |
| 6,144,549 A | * | 11/2000 | Moss et al. | 312/223.1 |
| 6,201,690 B1 | * | 3/2001 | Moore et al. | 312/223.1 |
| 6,305,019 B1 | * | 10/2001 | Dyer et al. | 725/117 |

OTHER PUBLICATIONS http://www.compaq.com/products/storageworks/options/1udrawerindex.html.
http://www.compaq.com/products/storageworks/options/skvm_index.html.
http://www.icsadvent.com/products/pdproductdetail.cfm?keyProduct=177.
http://www.raritan.com/pdf/mx4.pdf.

* cited by examiner

*Primary Examiner*—Ramesh Patel
(74) *Attorney, Agent, or Firm*—Snell & Wilmer L.L.P.

(57) ABSTRACT

An improved control and monitoring system for managing more than one computer system using a witch with a single connector for keyboard, video and mouse signals for each computer being managed. A notebook style display, keyboard, and pointing device attached to the switch provide a human interface. Each computer is attached to the switch using a cable having a single connector at the attachment point to the switch and separate connectors for keyboard, video, and pointing device signals at the attachment point to each computer, thus allowing a greater density of connections to computers without modifying the computers being controlled and monitored. Even greater densities may be realized by designating one switch as a master and attaching additional switches to the master.

17 Claims, 12 Drawing Sheets

SYSTEM AND METHOD FOR REMOTELY CONTROLLING AND MONITORING A PLURALITY OF COMPUTER SYSTEMS

STATEMENT REGARDING FEDERALLY SPONSORED RESEARCH OR DEVELOPMENT

Not applicable.

REFERENCE TO MICROFICHE APPENDIX

Not applicable.

COMPUTER PROGRAM LISTING APPENDIX

| Filename | Size in bytes | Date of creation |
| --- | --- | --- |
| ADMCTRL.HEX | 20,827 | 03/02/2000 01:43a |
| CPDnld.exe | 139,264 | 03/02/2000 01:40a |
| defNVRAM.hex | 19,725 | 03/24/2000 07:08p |
| hostdec.cmd | 74 | 03/24/2000 04:21p |
| hostdec.jed | 27,091 | 03/24/2000 01:13p |
| InstallCenterpoint16SW.doc | 44,544 | 03/24/2000 06:56p |
| maindec.cmd | 74 | 03/24/2000 04:15p |
| maindec.jed | 27,091 | 03/24/2000 01:16p |
| OPERCTRL.HEX | 88,593 | 03/02/2000 10:26p |
| OPERDNLD.HEX | 23,686 | 03/02/2000 01:43a |
| PORTCTRL.HEX | 15,811 | 03/02/2000 01:44a |
| proghost.bat | 142 | 03/24/2000 04:40p |
| progmain.bat | 142 | 03/24/2000 04:41p |

The file "InstallCenterpoint16SW.doc" appears as "INSTAL~1.DOC" on the compact disc.

BACKGROUND OF THE INVENTION

1. Field of the Invention

This invention relates to the control and monitoring of computers, specifically to an improved Keyboard-Video-Mouse switch fully integrated with a video display, character input device, and pointing device.

2. Discussion of the Prior Art

Many computers capable of performing general purpose and specialized tasks require a computer room with raised flooring and air conditioning. Because computer room space is quite expensive, such computers must be mounted in a rack. Having a separate video display, character input device, and pointing device for each computer is impractical and wastes valuable computer room space. Keyboard-Video-Mouse (KVM) switches were developed which allows a single video display, character input device, and pointing device to communicate with one or more rack-mounted computers. However, requiring a separate video display, a separate character input device, a separate pointing device, and a separate KVM switch has the disadvantages of:

(a) consuming valuable rack space (b) requiring a separate connector for video display, character input, and pointing data and signals on the KVM switch (c) likelihood of malfunction due to a loose connection or failure of the aforementioned connectors and cables (d) requiring the user to slide a video display monitor separately from a keyboard and pointing device from the rack before using the video display monitor and the keyboard and pointing device.

U.S. Pat. Nos. 5,721,842 (1998) and 5,884,096 (1999) and 5,937,176 (1999) to Beasley, et. al. (1998) merely specify a switching system but no display, character input device, or pointing device. Video signals are sent on cables separate from the keyboard and mouse signals. Furthermore, separate connectors are required on the switch side and on the remote computer side of cables used for video display, keyboard, and mouse. The programmable switch described as part of the claims uses only a single processor.

U.S. Pat. No. 5,732,212 to Perholtz, et. al. (1998) provides for a method of redirecting video display, keyboard, and mouse signals to a switch via a serial or parallel port or over a modem or network device on the computer being monitored or controlled. However, said method requires the use of special software or hardware which must be installed on the computer being monitored or controlled.

U.S. Pat. No. 5,499,377 to Lee (1996) describes a multi-computer access switching system. Although sixteen (16) computers may be accessed from a work center the system requires a cable bus and a manual switch rather than an electronically controlled switch which may be controlled by a command entered from a keyboard.

U.S. Pat. No. 5,949,643 to Batio (1999) describes a portable computer having split keyboard and pivotal display screen halves. Similarly, U.S. Pat. No. 5,926,364 to Karidis (1999) describes a tri-fold personal computer with touchpad and keyboard. U.S. Pat. No. 5,913,034 to Malcolm (1999) describes an administrator station for a computer system. However, such a device requires a notebook computer in order to function. In fact all of the described inventions and devices like them provide a display, keyboard, and pointing device but they are full fledged computers complete with CPU, memory, and secondary storage device and require an operating system in order to function. Such devices are relatively expensive and consume more power and space compared to a device which only has a display, keyboard, and pointing device.

Similarly, devices such as the device access controller in U.S. Pat. No. 5,878,248 to Tehranian, et. al. (1999) also require a computer. Such devices also do not offer the convenience of easily multiplexing keyboard data, pointer data, and video signals from multiple computers.

The reference http://www.compaq.com/products/storageworks/options/1udrawerindex.html describes a keyboard drawer which consumes 1U (1.75 in rack space and the reference http://www.compaq.com/products/storageworks/options/skvm_index.html describes a KVM switch which may be mounted behind the 1U keyboard drawer but a video display device must be mounted separately in a rack.

ICS provides a flat panel display attached by a hinge to a drawer for a keyboard and pointing device. However, it consumes 2U (1.75 inches ×2) of vertical rack space.

Raritan offers a KVM switch, which offers one processor per channel or computer system. However, only one processor is active at a time and only when the channel associated with it is actively selected. Raritan KVM switches also offer a single connector for each computer system but. the connector is wide and space consuming. The cascade mechanism used by Raritan does not utilize differential signaling for improved reliability.

Current KVM switches do not provide a means for upgrade, downloading or uploading of code, testing, or configuration of the KVM switch from a remote location. Furthermore, existing KVM switches do not have the capability of communicating with each other such that a plurality of interconnected KVM switches appear to the human user as a single KVM switch. The human user must be aware of which KVM switch a particular computer is connected in order to make use of the KVM switch. For example, the video output port, keyboard input port, and mouse input port of a first KVM switch must be connected into one of the video input ports, one of the keyboard output ports, and one of the mouse output ports of a second KVM switch. A human user must first select the video input port, keyboard output port, and mouse output port on the second KVM switch before the user is able to access the first KVM switch.

BRIEF SUMMARY OF THE INVENTION

In accordance with the present invention a intelligent control and monitoring system comprises at least one first processor communicating with a second processor, a video switch, video display, character input device, pointing device, and cable capable of carrying video signals, character input data, and pointing input data.

Objects and Advantages

Accordingly, several objects and advantages of the present invention are:

(a) To provide a compact control and monitoring system which minimizes the amount of rack space consumed by the following separate elements: KVM switch, video display, character input device, and pointing device;

(b) To provide a compact control and monitoring system which accepts data for video display and transmits data for character input and pointing to a computer but requires a single connector at the KVM switch;

(c) To provide a compact control and monitoring system which reduces the likelihood of a malfunction due to a loose connection or cable failure by reducing the number of cables and connections that must be made;

(d) To provide a compact control and monitoring system which extends out of a rack as a single unit;

Further objects and advantages are:

(a) To provide a control and monitoring system which allows upgrades, downloading or uploading of code, testing, and configuration from a remote location;

(b) To provide a control and monitoring system which can communicate with other control and monitoring systems;

(c) To provide a plurality of interconnected control and monitoring systems which appear to be a single control and monitoring system to a human user;

(d) To provide a control and monitoring system which has the ability to switch off power to the video display after a period of time has elapsed, where said period of time has been specified by a human user;

(e) To provide a control and monitoring system which utilizes a plurality of processing units, thereby reducing the likelihood of losing data from one of the computers connected to the compact control and monitoring system;

(f) To provide a control and monitoring system where a video display, a character input device, and a pointing device are protected from dust and impact from objects when the control and monitoring system is stored in a rack;

(g) To provide a control and monitoring system where no special software or hardware is required on the computer being monitored or controlled.

Reference Numerals In Drawings

Figure 1:
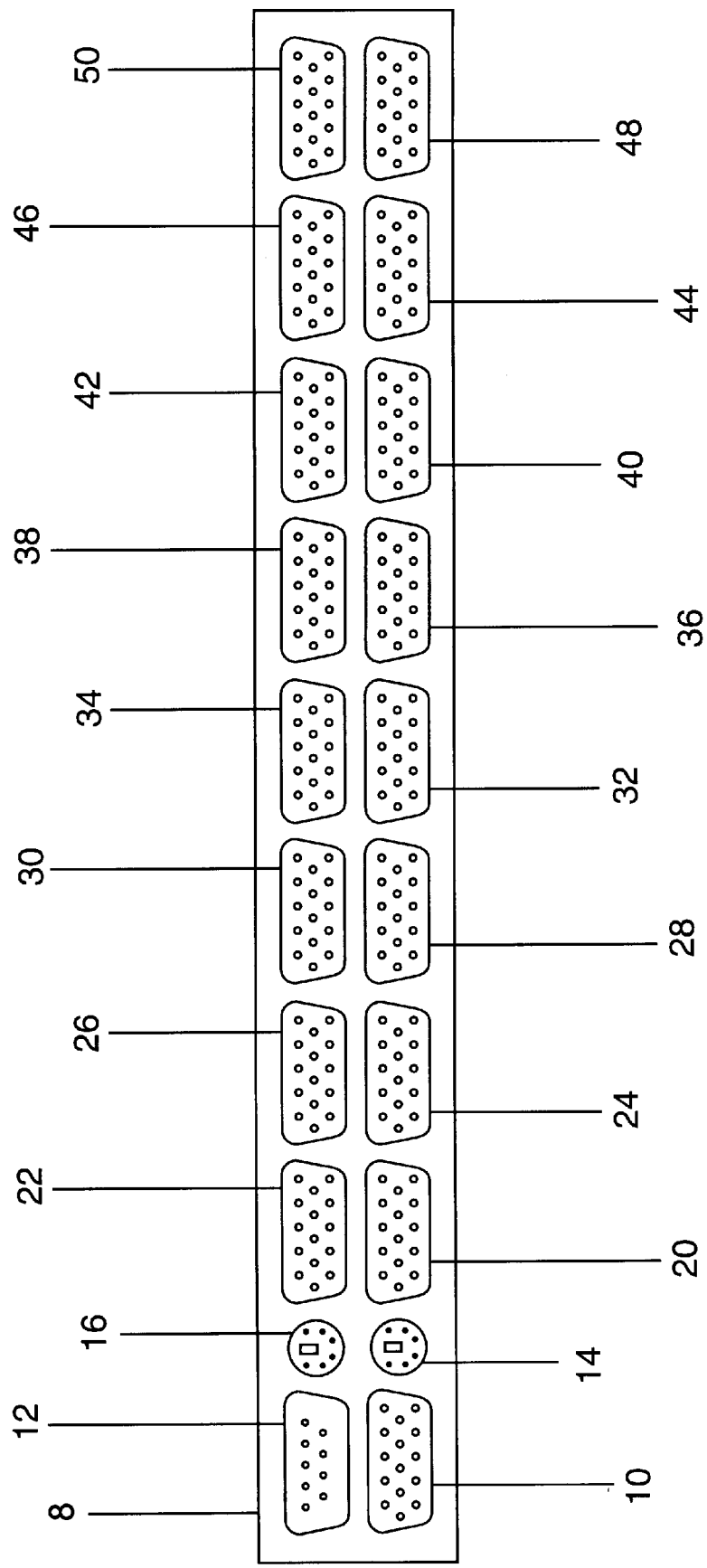
FIG. 1 shows a rear view of the main unit.

8 Housing
10 External Video Out—fifteen position D-sub
12 Communications Port
14 External Keyboard Porte—Mini-DIN
16 External Mouse Port—Mini-DIN
20 Keyboard-Video-Mouse Port 1—fifteen position D-sub
22 Keyboard-Video-Mouse Port 2—fifteen position D-sub
24 Keyboard-Video-Mouse Port 3—fifteen position D-sub
26 Keyboard-Video-Mouse Port 4—fifteen position D-sub
28 Keyboard-Video-Mouse Port 5—fifteen position D-sub
30 Keyboard-Video-Mouse Port 6—fifteen position D-sub
32 Keyboard-Video-Mouse Port 7—fifteen position D-sub
34 Keyboard-Video-Mouse Port 8—fifteen position D-sub
36 Keyboard-Video-Mouse Port 9—fifteen position D-sub
38 Keyboard-Video-Mouse Port 10—fifteen position D-sub
40 Keyboard-Video-Mouse Port 11—fifteen position D-sub
42 Keyboard-Video-Mouse Port 12—fifteen position D-sub
44 Keyboard-Video-Mouse Port 13—fifteen position D-sub
46 Keyboard-Video-Mouse Port 14—fifteen position D-sub
48 Keyboard-Video-Mouse Port 15—fifteen position D-sub
50 Keyboard-Video-Mouse Port 16—fifteen position D-sub
54 Internal Video Port—fifteen position D-sub
56 Internal Keyboard Port—Mini-DIN
58 Internal Mouse Port—Mini-DIN
60 DC Power Out to display, mouse, and keyboard
62 DC Power In
64 Power Supply AC Adapter receptacle
66 AC Power Supply
68 Video display
69 Housing for video display
70 Keyboard and touchpad housing
72 Keyboard
74 Touchpad
80 DC Power Cable
82 Cable stress relief arm
84 DC Power Cable
86 Mouse Cable
88 Keyboard Cable
90 Video Cable
92 Rail
94 Rail
100 Keyboard-Video-Mouse (KVM) Cable
102 KVM Connector—Male fifteen position D-sub
104 Video Connector—Male fifteen position D-sub
106 Keyboard Connector—Male Mini-DIN 108 Mouse Connector—Male Mini-DIN
121 KVM Connector Position 1—Red Video
122 KVM Connector Position 2—Green Video
123 KVM Connector Position 3—Blue Video
124 KVM Connector Position 4—Keyboard Power
125 KVM Connector Position 5—Keyboard Clock
126 KVM Connector Position 6—Video Ground
127 KVM Connector Position 7—Video Ground
128 KVM Connector Position 8—Video Ground
129 KVM Connector Position 9—Mouse Power
130 KVM Connector Position 10—Keyboard Data
131 KVM Connector Position 11—Mouse Clock
132 KVM Connector Position 12—Mouse Data
133 KVM Connector Position 13—Horizontal Sync
134 KVM Connector Position 14—Vertical Sync
135 KVM Connector Position 15—Keyboard and Mouse Ground
141 Video Connector Position 1—Red Video.
142 Video Connector Position 2—Green Video
143 Video Connector Position 3—Blue Video
144 Video Connector Position 4—ID BIT 2
145 Video Connector Position 5—DDC Signal Return
146 Video Connector Position 6—Red Video Signal Return
147 Video Connector Position 7—Green Video Signal Return
148 Video Connector Position 8—Blue Video Signal Return
149 Video Connector Position 9—Power Line for DDC
150 Video Connector Position 10—SYNC Signal Return
151 Video Connector Position 11—ID Bit 11 (Reserved)
152 Video Connector Position 12—Data Line for DDC
153 Video Connector Position 13—Horizontal Sync
154 Video Connector Position 14—Vertical Sync
155 Clock Line for DDC
161 KB Connector Position 1—Keyboard Data
162 KB Connector Position 2—No Connection
163 KB Connector Position 3—Signal Ground
164 KB Connector Position 4—+5V Supply
164 KB Connector Position 5—KB Clock
166 KB Connector Position 6—No Connection
171 Mouse Connector Position 1—Mouse Data
172 Mouse Connector Position 2—No Connection
173 Mouse Connector Position 3—Signal Ground
174 Mouse Connector Position 4—+5 Supply
175 Mouse Connector Position 5—Mouse Clock
176 Mouse Connector Position 6—No Connection
200 Keyboard and Mouse signals to KVM port 20
202 Keyboard and Mouse signals to KVM port 22
204 Keyboard and Mouse signals to KVM port 24
206 Keyboard and Mouse signals to KVM port 26
208 Keyboard and Mouse signals to KVM port 28
210 Keyboard and Mouse signals to KVM port 30
212 Keyboard and Mouse signals to KVM port 32
214 Keyboard and Mouse signals to KVM port 34
216 Keyboard and Mouse signals to KVM port 36
218 Keyboard and Mouse signals to KVM port 38
220 Keyboard and Mouse signals to KVM port 40
222 Keyboard and Mouse signals to KVM port 42
224 Keyboard and Mouse signals to KVM port 44
226 Keyboard and Mouse signals to KVM port 46
228 Keyboard and Mouse signals to KVM port 48
230 Keyboard and Mouse signals to KVM port 50
232 Processor
234 Processor
236 Processor
238 Processor
240 Processor
242 Processor
244 Processor
246 Processor
248 Clock generator for processor 232
250 Clock signal
252 Clock generator for processor 234
254 Clock signal
256 Clock generator for processor 236
258 Clock signal
260 Clock generator for processor 238
262 Clock signal
264 Clock generator for processor 240
266 Clock signal
268 Clock generator for processor 242
270 Clock signal
272 Clock generator for processor 244
274 Clock signal
276 Clock generator for processor 246
278 Clock signal
280 Keyboard and Mouse signals from processor 232
282 Keyboard and Mouse signals from processor 234
284 Keyboard and Mouse signals from processor 236
286 Keyboard and Mouse signals from processor 238
288 Keyboard and Mouse signals from processor 240
290 Keyboard and Mouse signals from processor 242
292 Keyboard and Mouse signals from processor 244
294 Keyboard and Mouse signals from processor 246
296 Processor
298 Programmable Logic
300 Control
302 Non-volatile Random Access Memory (NVRAM)
304 Control
306 Data
308 Flash memory
310 Data
312 Clock generator
314 Clock signal
316 Keyboard signals
318 Mouse signals
320 Data
322 Video Select
324 Video Switch
326 Red, Green, Blue, Horizontal sync, and Vertical sync video signals from KVM Port 20
328 Red, Green, Blue, Horizontal sync, and Vertical sync video signals from KVM Port 22
330 Red, Green, Blue, Horizontal sync, and Vertical sync video signals from KVM Port 24
332 Red, Green, Blue, Horizontal sync, and Vertical sync video signals from KVM Port 26
334 Red, Green, Blue, Horizontal sync, and Vertical sync video signals from KVM Port 28
336 Red, Green, Blue, Horizontal sync, and Vertical sync video signals from KVM Port 30
338 Red, Green, Blue, Horizontal sync, and Vertical sync video signals from KVM Port 32
340 Red, Green, Blue, Horizontal sync, and Vertical sync video signals from KVM Port 34
342 Red, Green, Blue, Horizontal sync, and Vertical sync video signals from KVM Port 36
344 Red, Green, Blue, Horizontal sync, and Vertical sync video signals from KVM Port 38
346 Red, Green, Blue, Horizontal sync, and Vertical sync video signals from KVM Port 40
348 Red, Green, Blue, Horizontal sync, and Vertical sync video signals from KVM Port 42
350 Red, Green, Blue, Horizontal sync, and Vertical sync video signals from KVM Port 44

352 Red, Green, Blue, Horizontal sync, and Vertical sync video signals from KVM Port 46
354 Red, Green, Blue, Horizontal sync, and Vertical sync video signals from KVM Port 48
356 Red, Green, Blue, Horizontal sync, and Vertical sync video signals from KVM Port 50
358 Horizontal sync
360 Vertical sync
362 Red, Green, and Blue video signals
364 Programmable Logic
366 Data
367 Horizontal Sync and Vertical sync
368 Data
370 Processor
372 Clock generator
374 Clock signal
376 EIA-RS-232 Transmitter/Receiver
378 EIA-RS-485 Transceiver
380 EIA-RS-485 Transceiver
382 EIA-RS-485 Transceiver
384 Transmit Data (TX)
386 Receive Data (RX)
388 Transmit Data (TX)
390 Receive Data (RX)
392 Differential Transmit/Receive High(Tx+)
396 Differential Transmit/Receive Low(Tx−)
398 Single-ended Transmit/Receive
400 Differential Receive/Transmit High(Rx+)
404 Differential Receive/Transmit Low(Rx−)
406 Single-ended Receive/Transmit
408 Differential Clock Out/In High (Clock+)
412 Differential Clock In/Out Low (Clock−)
414 Single-ended Clock In/Out
420 Video Driver
422 Red, Green, Blue, Horizontal sync, Vertical sync
424 Red, Green, Blue, Horizontal sync, Vertical sync
440 Daisy Chain cable
442 Connector for Communications Port and Daisy Chain
444 Connector for Communications Port and Daisy Chain
446 Connector for Communications Port and Termination
448 Connector for Communications Port and Termination
450 Connector for Communications Port and Daisy Chain position 1—EIA-RS-485 Tx+
452 Connector for Communications Port and Daisy Chain position 2—EIA-RS-232 TxD
454 Connector for Communications Port and Daisy Chain position 3—EIA-RS-232 RxD
456 Connector for Communications Port and Daisy Chain position 4—EIA-RS-485 Rx−
458 Connector for Communications Port and Daisy Chain position 5—Ground
460 Connector for Communications Port and Daisy Chain position 6—EIA-RS-485 Tx−
462 Connector for Communications Port and Daisy Chain position 7—EIA-RS-485 Clock−
464 Connector for Communications Port and Daisy Chain position 8—EIA-RS-485 Clock+
466 Connector for Communications Port and Daisy Chain position 9—EIA-RS-485 Rx+
468 Connector for Communications Port and Termination position 1—EIA-RS-485 Tx+
470 Connector for Communications Port and Termination position 2—EIA-RS-232 TxD
472 Connector for Communications Port and Termination position 3—EIA-RS-232 RxD
474 Connector for Communications-Port and Termination position 4—EIA-RS-485 Rx−
476 Connector for Communications Port and Termination position 5—Ground
478 Connector for Communications Port and Termination position 6—EIA-RS-485 Tx−
480 Connector for Communications Port and Termination position 7—EIA-RS-485 Clock−
482 Connector for Communications Port and Termination position 8—EIA-RS-485 Clock+
484 Connector for Communications Port and Termination position 9—EIA-RS-485 Rx+
486 Connector for Communications Port and Daisy Chain position 1—EIA-RS-485 Tx+
488 Connector for Communications Port and Daisy Chain position 2—EIA-RS-232 TxD
490 Connector for Communications Port and Daisy Chain position 3—EIA-RS-232 RxD
492 Connector for Communications Port and Daisy Chain position 4—EIA-RS-485 Rx−
494 Connector for Communications Port and Daisy Chain position 5—Ground
496 Connector for Communications Port and Daisy Chain position 6—EIA-RS-485 Tx−
498 Connector for Communications Port and Daisy Chain position 7—EIA-RS-485 Clock−
500 Connector for Communications Port and Daisy Chain position 8—EIA-RS-485 Clock+
502 Connector for Communications Port and Daisy Chain position 9—EIA-RS-485 Rx+
504 Connector for Communications Port and Termination position 1—EIA-RS-485 Tx+
506 Connector for Communications Port and Termination position 2—EIA-RS-232 TxD
508 Connector for Communications Port and Termination position 3—EIA-RS-232 RxD
510 Connector for Communications Port and Termination position 4—EIA-RS-485 Rx−
512 Connector for Communications Port and Termination position 5—Ground
514 Connector for Communications Port and Termination position 6—EIA-RS-485 Tx−
516 Connector for Communications Port and Termination position 7—EIA-RS-485 Clock−
518 Connector for Communications Port and Termination position 8—EIA-RS-485 Clock+
520 Connector for Communications Port and Termination position 9—EIA-RS-485 Rx+
610 Terminator for Daisy Chain
612 Resistor
614 Resistor
616 Resistor
620 Terminator Position 1
626 Terminator Position 4
630 Terminator Position 6
632 Terminator Position 7
634 Terminator Position 8
636 Terminator Position 9

DETAILED DESCRIPTION OF THE INVENTION

Preferred Embodiment—FIGS. 1, 2, 3, and 4

A preferred embodiment of the control and monitoring system of the present invention is illustrated in FIG. 1 (rear view). In the presently preferred embodiment of the control and monitoring system, up to sixteen (16) computer systems may be controlled and monitored from a single control and monitoring system and up to two hundred fifty six (256) if a plurality of control and monitoring systems are connected together. However, those skilled in the art will recognize that the number of possible connections may be modified to accommodate an unlimited number of computer systems.

A main unit housing 8 provides a mounting base for the Mini-DIN, DB9, and fifteen position D-sub connectors. An external video display device compatible with the VGA standard may be connected to an External Video Port 10. An External keyboard may be connected to an External Keyboard Port 14. An external mouse or other pointing device may be connected to an External Mouse Port 16. A computer or communications device capable of communicating with a computer may be connected via a standard IBM-type DB9 serial cable to the Communications Port 12. A computer system may be connected to any of Keyboard-Video-Mouse (KVM) Ports 1–16 (20,22,24,26,28,30,32,34,36,38,40,42, 44,46,48,50).

Figure 2:
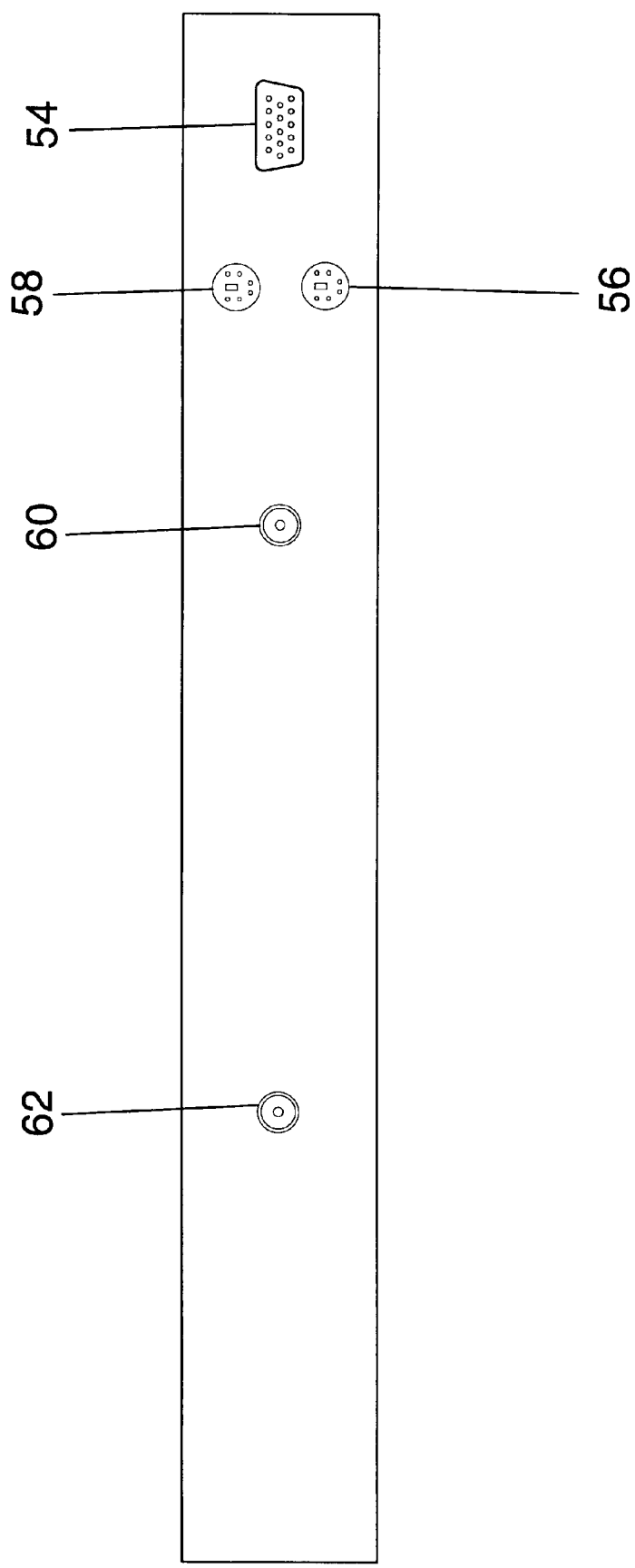
FIG. 2 shows front view of the main unit.

FIG. 2 details the present front view of the main unit 8 of the control and monitoring system. Power is supplied to the control and monitoring system through a power connector 62. Power to a video display 68 (FIG. 4), a keyboard 72, and a touchpad 74 (FIG. 3) is sent out through a power connector 60. The video display 68 is connected to an internal video port 54. The keyboard 72 is connected to an internal keyboard port 56. The touchpad 74 is connected to an internal mouse port 58.

Figure 3:
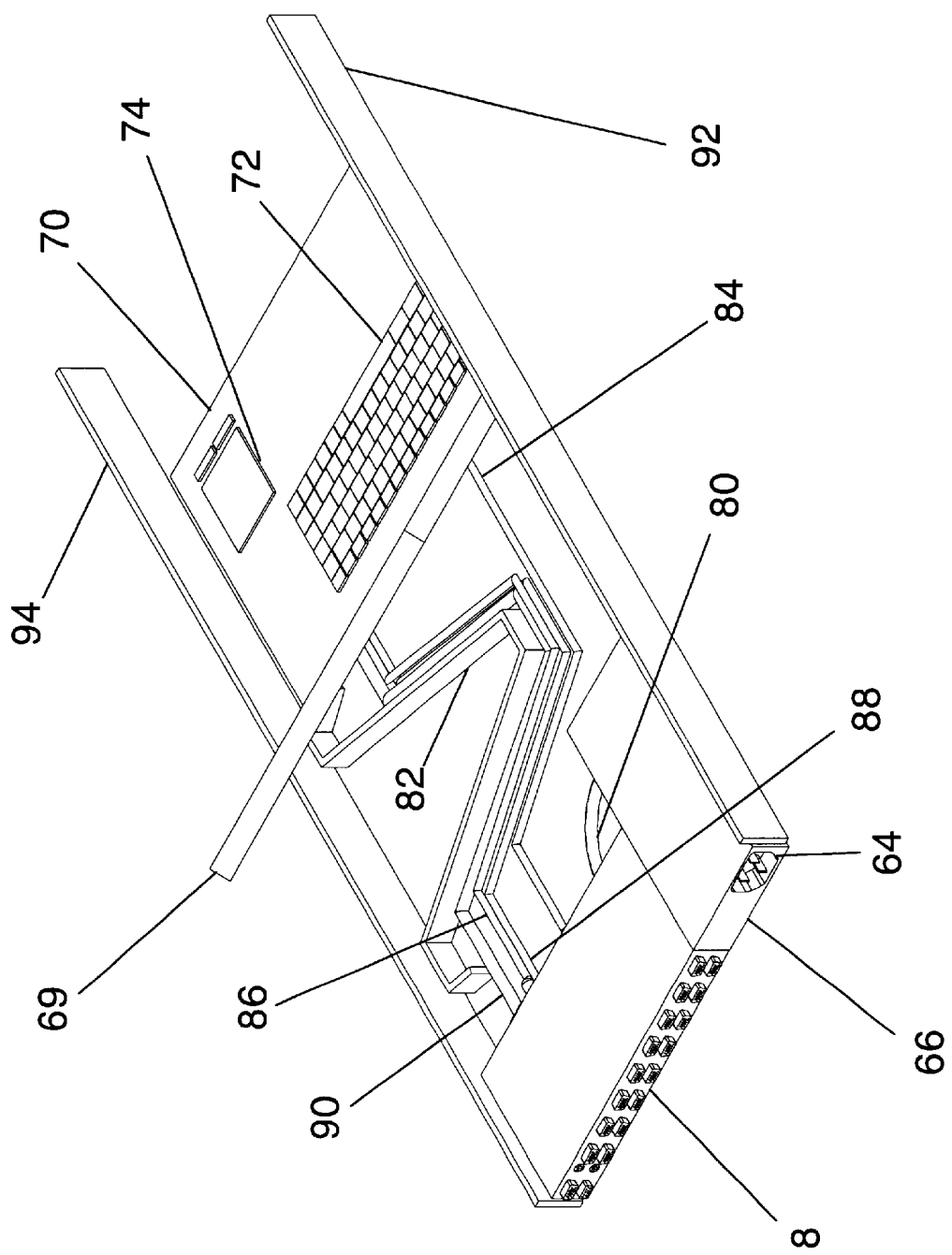
FIG. 3 shows a rear view as installed in a rack.

FIG. 3 details the present rear view of the control and monitoring system in the open position. A power supply 66 receives power when a power cord is plugged into AC power receptacle 64 and connecting the male end of the three-prong AC power cord into a source for AC power such as a public utility wall outlet or a battery backup system. The control and monitoring system receives power from a power supply cable 80 connected to a power connector 60. A first housing 69 houses a display 68. A second housing 70 houses a combined keyboard and pointing device comprising a keyboard 72, and a touchpad 74. The first housing and second housing are rotatably connected such that the display may be stored against the keyboard and pointing device and flipped out when needed. The first housing and second housing so connected are referred to as the administration station. The second housing may have a cowling or cover in a shape complementary to the shape of the power supply 66 and the main unit housing 8 such that any cables running between the administration station and the main unit housing B are covered when the administration station is stored. A power cable 84 supplies power from the main unit housing 8 through a power connector 60 to a display 68, a keyboard 72, and a pointing device 74. A keyboard cable 86 connects the internal keyboard port 56 to the keyboard 72. A mouse cable 88 connects the internal mouse port 58 to the touchpad 74. A video cable 90 connects the internal video port 54 to the video display 68. A cable tray arm 82 relieves stress on the cables, organizes the cables neatly and prevents them from tangling. The main unit 8 is connected to the power supply 66 and attached to a rail 92 and a rail 94. The cable tray arm 82 is attached to the rail 94. The keyboard 72, touchpad 74, and display 68 are mounted on a rail 92 and a rail 94 and may slide forward and backward along the rails. The display 68 rotates up and down via two hinges or other rotation mechanism.

Figure 4:
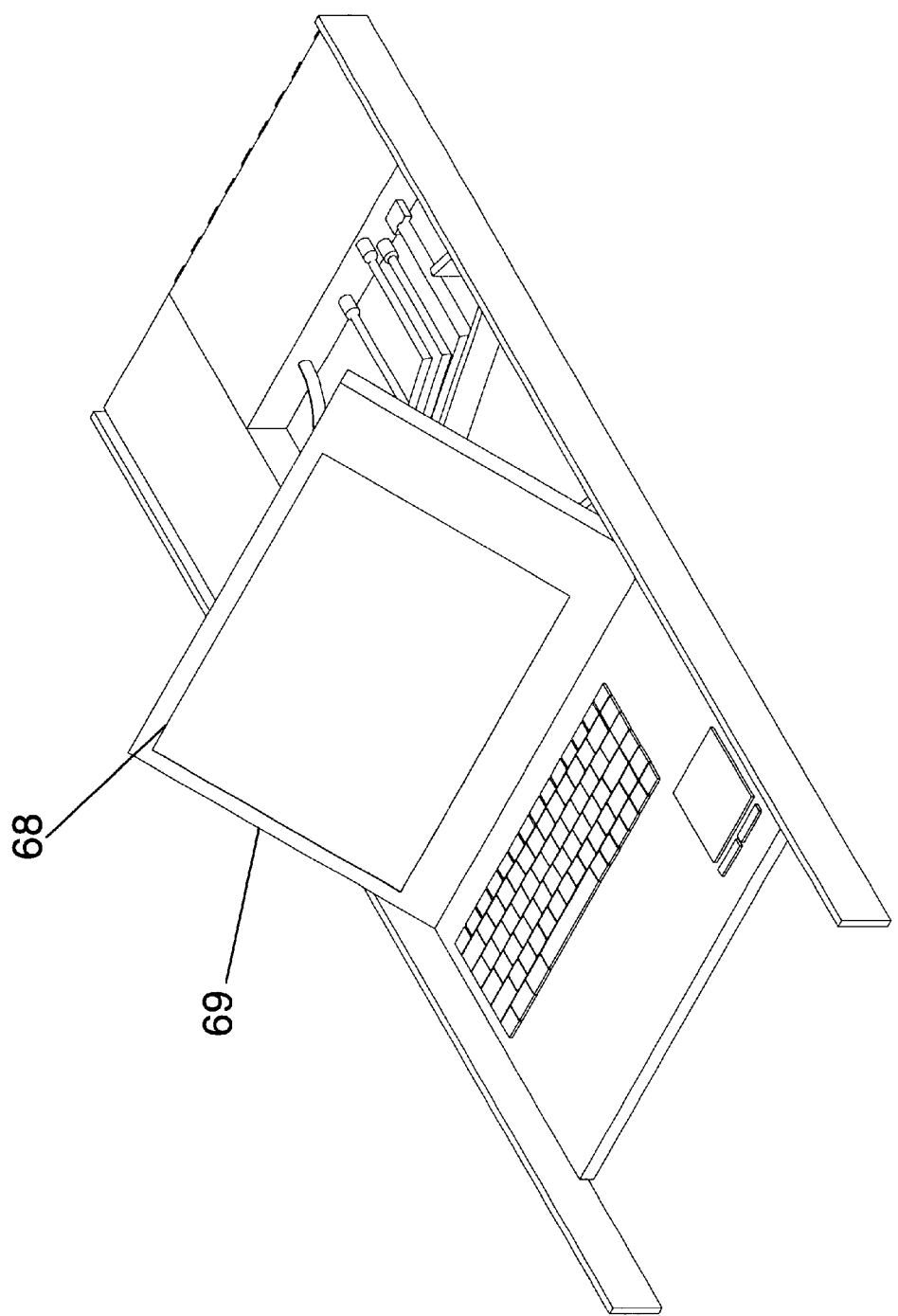
FIG. 4 shows a front view as installed in a rack.

FIG. 4 details the present front view of the control and monitoring system in an open position. The control and monitoring system may be mounted in a standard nineteen-inch wide rack but may also be used without the benefit of a rack. The preferred embodiment of the present invention consumes not more than 1U (1.75 inches) of vertical space while the keyboard 72, touchpad 74, and display 68 are in the stored position of course, the control and monitoring system may consume more or less vertical space while maintaining a compact profile.

Figure 5:
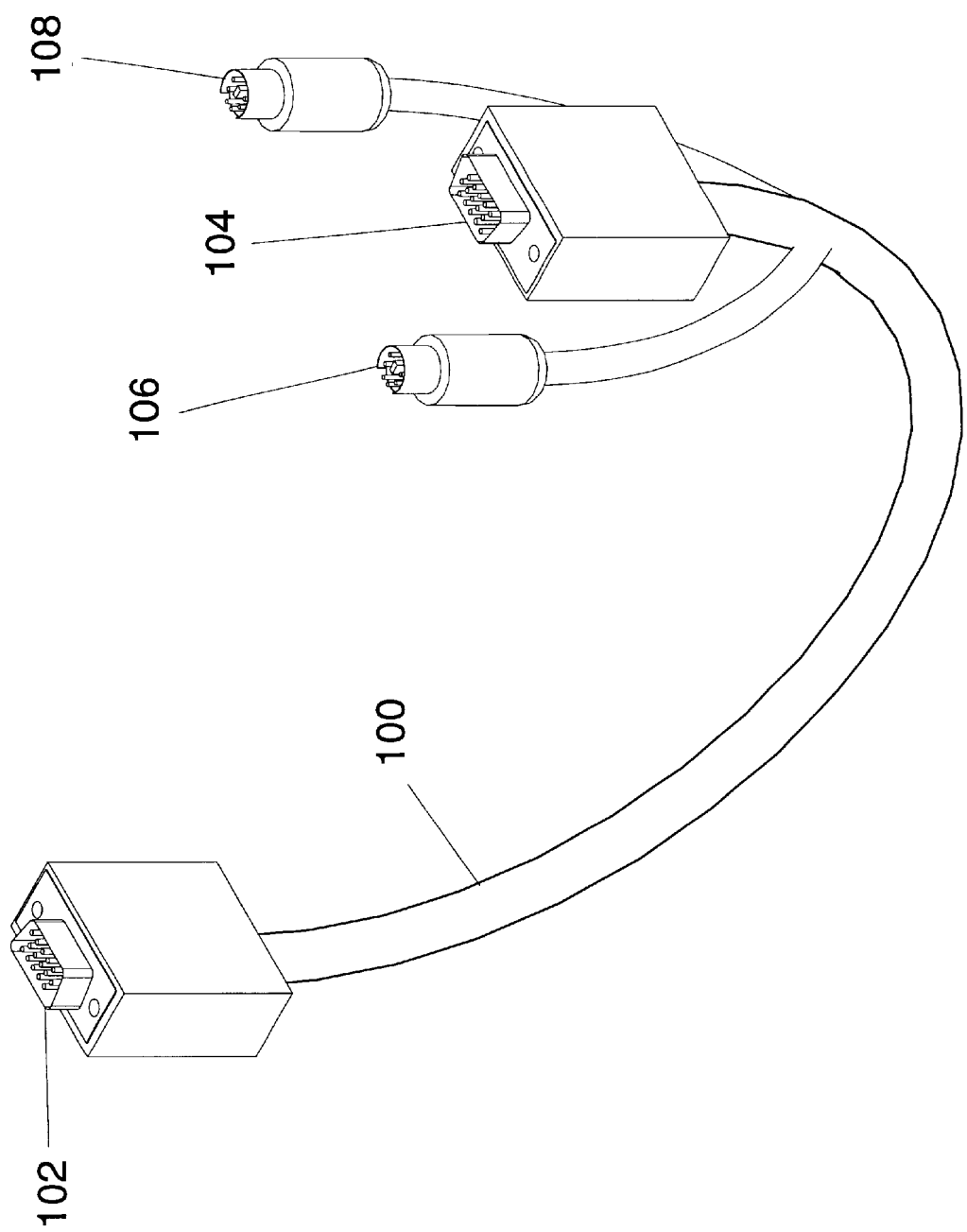
FIG. 5 shows a cable used to connect a computer system to the and monitoring system.

FIG. 5 details a cable used to connect a computer system to any of the KVM Ports 1–16. The fifteen position D-sub connector 102 connects to any of the KVM Ports 1–16 (20,22,24,26,28,30,32,34,36,38,40, 42,44,46,48,50). The fifteen position D-sub connector 104 connects to the graphics adapter of the remote computer. The mini-DIN connector 106 connects to the keyboard port of the remote computer. The mini-DIN connector 108 connects to the mouse port of the remote computer.

Figure 6:
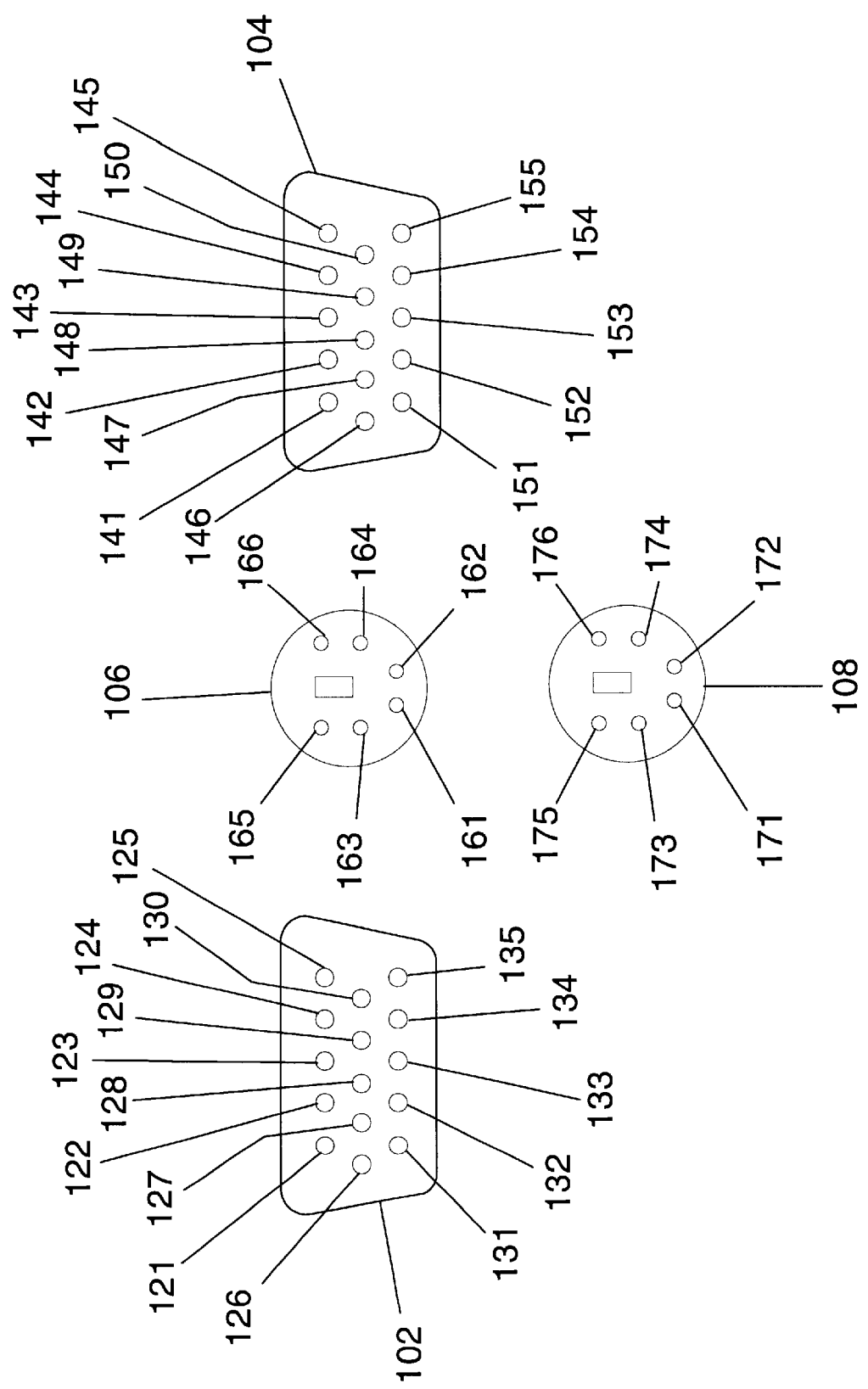
FIG. 6 shows the connectors used on the cable used to connect a computer system to the control and monitoring system.

FIG. 6 details a head on view of the connectors shown in FIG. 5. The positions are connected in the following manner:

| Keyboard-Video-Mouse (KVM) Male fifteen position D-sub Connector 102 Position | Connection Description | Position Connection |
|---|---|---|
| KVM Connector Position 121 | Red Video | Video Connector Position 141 |
| KVM Connector Position 122 | Green Video | Video Connector Position 142 |
| KVM Connector Position 123 | Blue Video | Video Connector Position 143 |
| KVM Connector Position 124 | Keyboard Power | Keyboard Connector Position 164 |
| KVM Connector Position 125 | Keyboard Clock | Keyboard Connector Position 165 |
| KVM Connector Position 126 | Red Video Signal Return | Video Connector Position 146 |
| KVM Connector Position 127 | Green Video Signal Return | Video Connector Position 147 |
| KVM Connector Position 128 | Blue Video Signal Return | Video Connector Position 148 |
| KVM Connector Position 129 | Mouse Power | Mouse Connector Position 174 |
| KVM Connector Position 130 | Keyboard Data | Keyboard Connector Position 161 |
| KVM Connector Position 131 | Mouse Clock | Mouse Connector Position 175 |
| KVM Connector Position 132 | Mouse Data | Mouse Connector Position 171 |
| KVM Connector Position 133 | Horizontal Sync | Video Connector Position 153 |
| KVM Connector Position 134 | Vertical Sync | Video Connector Position 154 |
| KVM Connector Position 135 | Keyboard and Mouse Ground | Keyboard Connector Position 163 and Mouse Connector Position 173 |

Additionally, the cable shield runs along the portion of the KVM cable 100 extending from the Keyboard-Video-Mouse Male fifteen position D-sub Connector 102,side to the Video Male fifteen position D-sub Connector 104 side.

Figure 7:
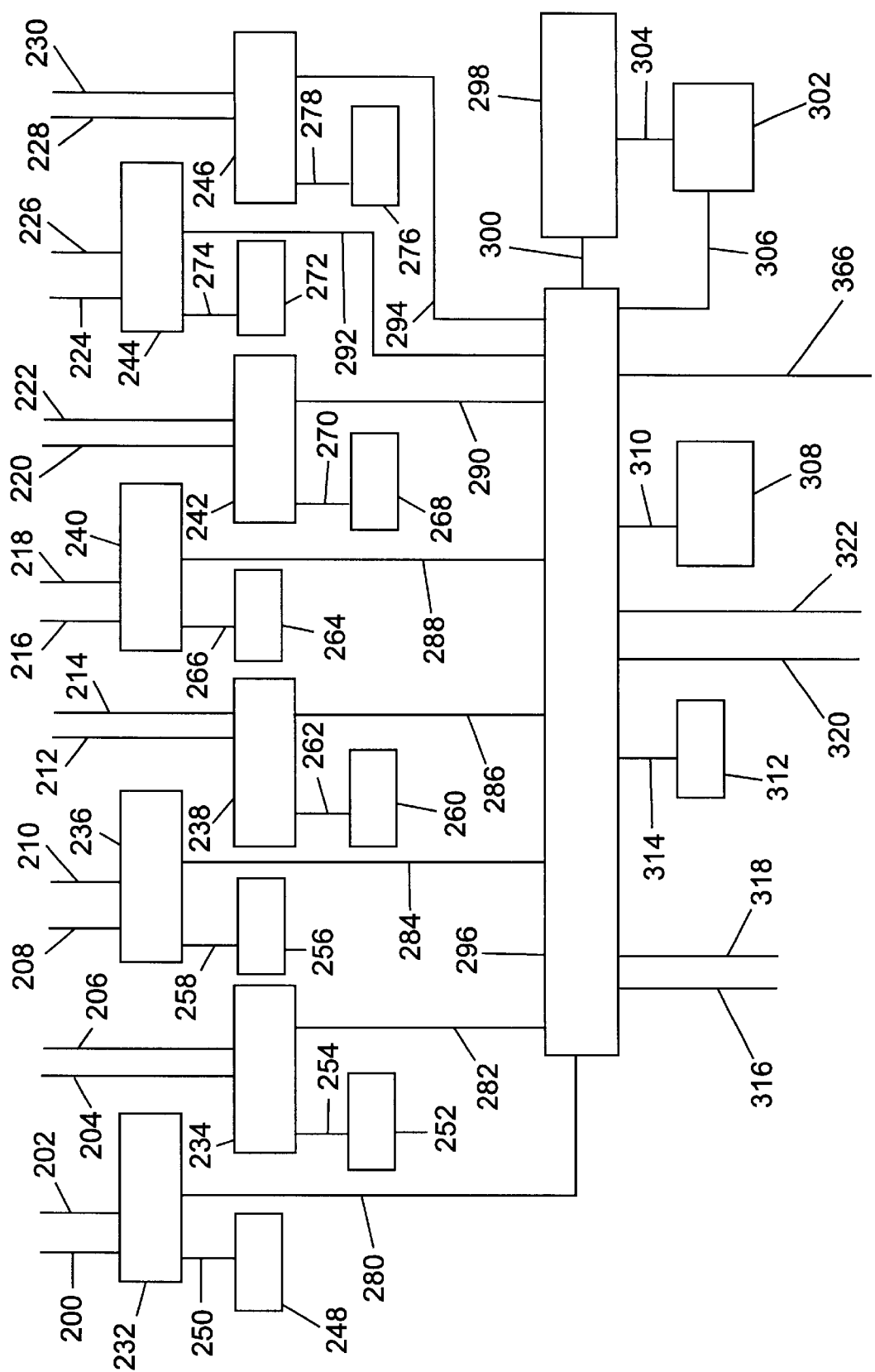
FIGS. 7 and 8 show a block diagram of the control and monitoring system.
Figure 8:
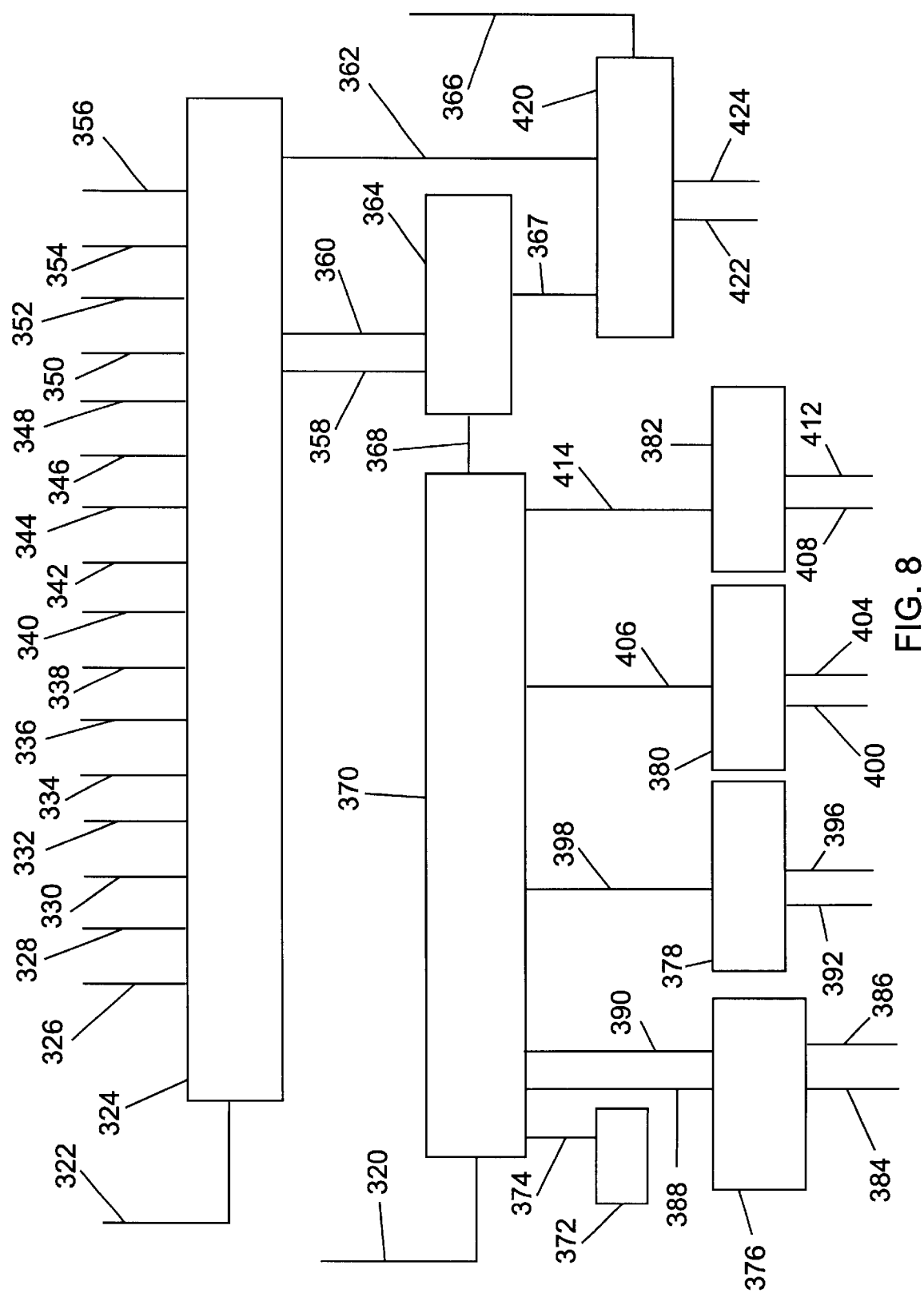

FIGS. 7 and 8 depict a block diagram of the control and monitoring system. Two Keyboard-Video-Mouse (KVM) ports (20,22,24,26,28,30,32,34, 36,38,40,42,44,46,48,50) connect to a processor 232, 234, 236, 238, 240, 242, 244, or 246. Each of the processors controls two KVM ports. All eight processors 232, 234, 236, 238, 240, 242, 244, and 246 connect to a processor 296. Processor 296 connects to a video switch 324 and a processor 320.

Keyboard and mouse signals 200 are sent and received between a KVM port 48 and a processor 232.

Keyboard and mouse signals 202 are sent and received between a KVM port 50 and a processor 232.

Keyboard and mouse signals 204 are sent and received between a KVM port 44 and a processor 234.

Keyboard and mouse signals 206 are sent and received between a KVM port 46 and a processor 234.

Keyboard and mouse signals 208 are sent and received between a KVM port 40 and a processor 236.

Keyboard and mouse signals 210 are sent and received between a KVM port 42 and a processor 236.

Keyboard and mouse signals 212 are sent and received between a KVM port 36 and a processor 238.

Keyboard and mouse signals 214 are sent and received between a KVM port 38 and a processor 238.

Keyboard and mouse signals 216 are sent and received between a KVM port 32 and a processor 240.

Keyboard and mouse signals 218 are sent and received between a KVM port 34 and a processor 240.

Keyboard and mouse signals 220 are sent and received between a KVM port 28 and a processor 242.

Keyboard and mouse signals 222 are sent and received between a KVM port 30 and a processor 242.

Keyboard and mouse signals 224 are sent and received between a KVM port 24 and a processor 244.

Keyboard and mouse signals 226 are sent and received between a KVM port 26 and a processor 244.

Keyboard and mouse signals 228 are sent and received between a KVM port 20 and a processor 246.

Keyboard and mouse signals 230 are sent and received between a KVM port 22 and a processor 246.

A clock generator 248 provides a clock signal 250 to processor 232.

A clock generator 252 provides a clock signal 254 to processor 234.

A clock generator 256 provides a clock signal 258 to processor 236.

A clock generator 260 provides a clock signal 262 to processor 238.

A clock generator 264 provides a clock signal 266 to processor 240.

A clock generator 268 provides a clock signal 270 to processor 242.

A clock generator 272 provides a clock signal 274 to processor 244.

A clock generator 276 provides a clock signal 278 to processor 246.

A processor 296 is connected to processors 232, 234, 236, 238, 240, 242, 244, and 246. A clock generator 312 provides a clock signal 314 to processor 296. Data signals 310 travel between a flash memory 308 and a processor 296. Data signals 300 travel between a programmable logic device and processor 296. Data signals 306 travel between a Non-volatile Random Access Memory (NVRAM) 302 and a processor 296. Control signals 304 travel between a NVRAM 302 and a programmable logic device 298.

Processors 232, 234, 236, 238, 240, 242, 244, and 246 are referred to as Port Controllers.

Keyboard signals 316 travels between a processor 296 and keyboard ports 14 and 56. Mouse signals 318 travel between a processor 296 and mouse ports 16 and 58.

FIG. 8 shows a video switch 324. A processor 296 asserts a video select signal 322 to a video switch 324. Processor 296 is referred to as the Main Controller.

Red, Green, Blue, Vertical Sync, and Horizontal Sync video signals 326 pass from KVM port 20 to video switch 324.

Red, Green, Blue, Vertical Sync, and Horizontal Sync video signals 328 pass from KVM port 22 to video switch 324.

Red, Green, Blue, Vertical Sync, and Horizontal Sync video signals 330 pass from KVM port 24 to video switch 324.

Red, Green, Blue, Vertical Sync, and Horizontal Sync video signals 332 pass from KVM port 26 to video switch 324.

Red, Green, Blue, Vertical Sync, and Horizontal Sync video signals 334 pass from KVM port 28 to video switch 324.

Red, Green, Blue, Vertical Sync, and Horizontal Sync video signals 336 pass from KVM port 30 to video switch 324.

Red, Green, Blue, Vertical Sync, and Horizontal Sync video signals 338 pass from KVM port 32 to video switch 324.

Red, Green, Blue, Vertical Sync, and Horizontal Sync video signals 340 pass from KVM port 34 to video switch 324.

Red, Green, Blue, Vertical Sync, and Horizontal Sync video signals 342 pass from KVM port 36 to video switch 324.

Red, Green, Blue, Vertical Sync, and Horizontal Sync video signals 344 pass from KVM port 38 to video switch 324.

Red, Green, Blue, Vertical Sync, and Horizontal Sync video signals 346 pass from KVM port 40 to video switch 324.

Red, Green, Blue, Vertical Sync, and Horizontal Sync video signals 348 pass from KVM port 42 to video switch 324.

Red, Green, Blue, Vertical Sync, and Horizontal Sync video signals 350 pass from KVM port 44 to video switch 324.

Red, Green, Blue, Vertical Sync, and Horizontal Sync video signals 352 pass from KVM port 46 to video switch 324.

Red, Green, Blue, Vertical Sync, and Horizontal Sync video signals 354 pass from KVM port 48 to video switch 324.

Red, Green, Blue, Vertical Sync, and Horizontal Sync video signals 356 pass from KVM port 50 to video switch 324.

Control 368 travels between a programmable logic device 364 and a processor 370. Data 320 travels between a processor 296 and a processor 370. A clock generator 372 provides a clock signal 374 to a processor 370. Processor 370 is referred to as the Host Controller.

Transmit Data (TX) signals 384 travels from an EIA-RS-232 port 12 to an EIA-RS-232 Transmitter/Receiver 376. Receive Data (RX) signals 386 travels from an EIA-RS-232 Transmitter/Receiver 376 to an EIA-RS-232 port 12. TX data signals 386 travel from an EIA-RS-232 Transmitter/Receiver to a processor 370. RX data signals 390 travel from a processor 370 to an EIA-RS-232 Transmitter/Receiver 376.

A single-ended transmit/receive data signal 398 travels between a processor 370 and an EIA-RS-485 transceiver 378. A differential transmit/receive data high signal 392 travels between the EIA-RS-485 transceiver 378 and the communications port 12. A differential transmit/receive data low signal 396 travels between the EIA-RS-485 transceiver 378 and the communications port 12.

A differential receive/transmit data high signal 400 travels between the communications port 12 and an EIA-RS-485 transceiver 380. A single-ended receive/transmit data signal 406 travels between the EIA-RS-485 transceiver 380 and the processor 370. A differential receive/transmit data low signal 404 travels between the communications port 12 and the EIA-RS-485 transceiver 380.

A single-ended clock signal 414 passes between the processor 370 and an EIA-RS-485 transceiver 382. A differential clock high signal 408 passes between the EIA-RS-485 transceiver 382 and the communications port 12. A differential clock low signal 412 travels between the communications port 12 and the EIA-RS-485 transceiver 382. A Horizontal Sync signal 358 passes from a video switch 324 to a programmable logic device 364. A Vertical Sync signal 360 passes from a video switch 324 to a programmable logic device 364.

Horizontal Sync and Vertical Sync signals 367 pass from a programmable logic device 364 to a Video Driver 420. On screen menu display data passes over data path 366 from a programmable logic device 364 to a Video Driver 420.

Red, Green, and Blue video signals 362 pass from a video switch 324 to video driver 420.

Video driver 420 takes the Red, Green, and Blue video signals 362, and the Horizontal and Vertical Sync signals 367 and sends Red, Green, Blue, Horizontal Sync, and Vertical Sync signals 422 to video port 10 and Red, Green, Blue, Horizontal Sync, and Vertical Sync signals 424 are sent video port 54.

Figure 9:
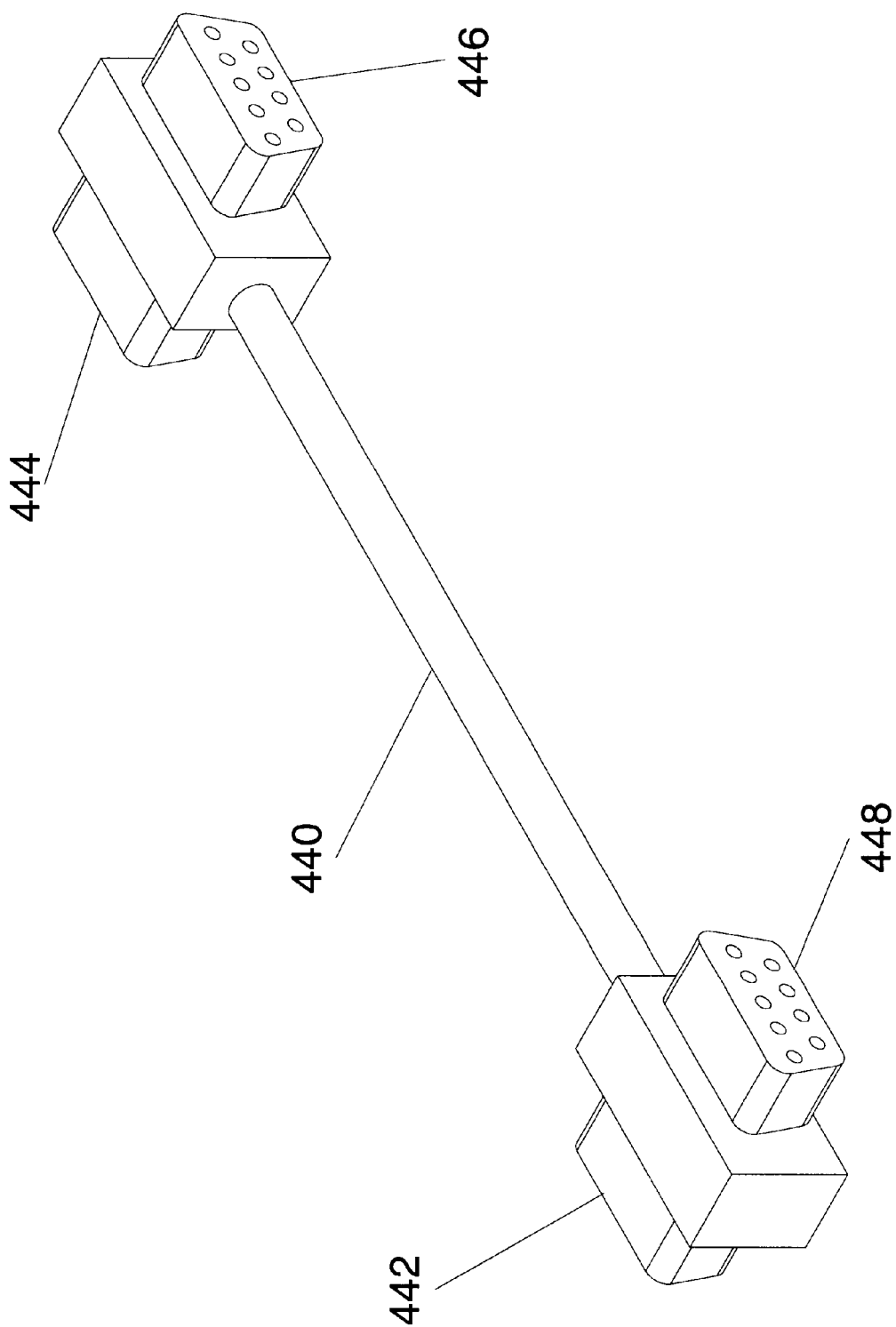
FIG. 9 shows a cable used to daisy chain multiple control and monitoring systems together.

FIG. 9 shows a daisy chain cable 440 used to daisy chain multiple control and monitoring systems together. A connector for the communications port and daisy chain 444 and a connector for the communications port and termination 446 comprises one end of the cable. A connector for the communications port and daisy chain 442 and a connector for the communications port and termination 448 comprise the other end of the cable.

Figure 10:
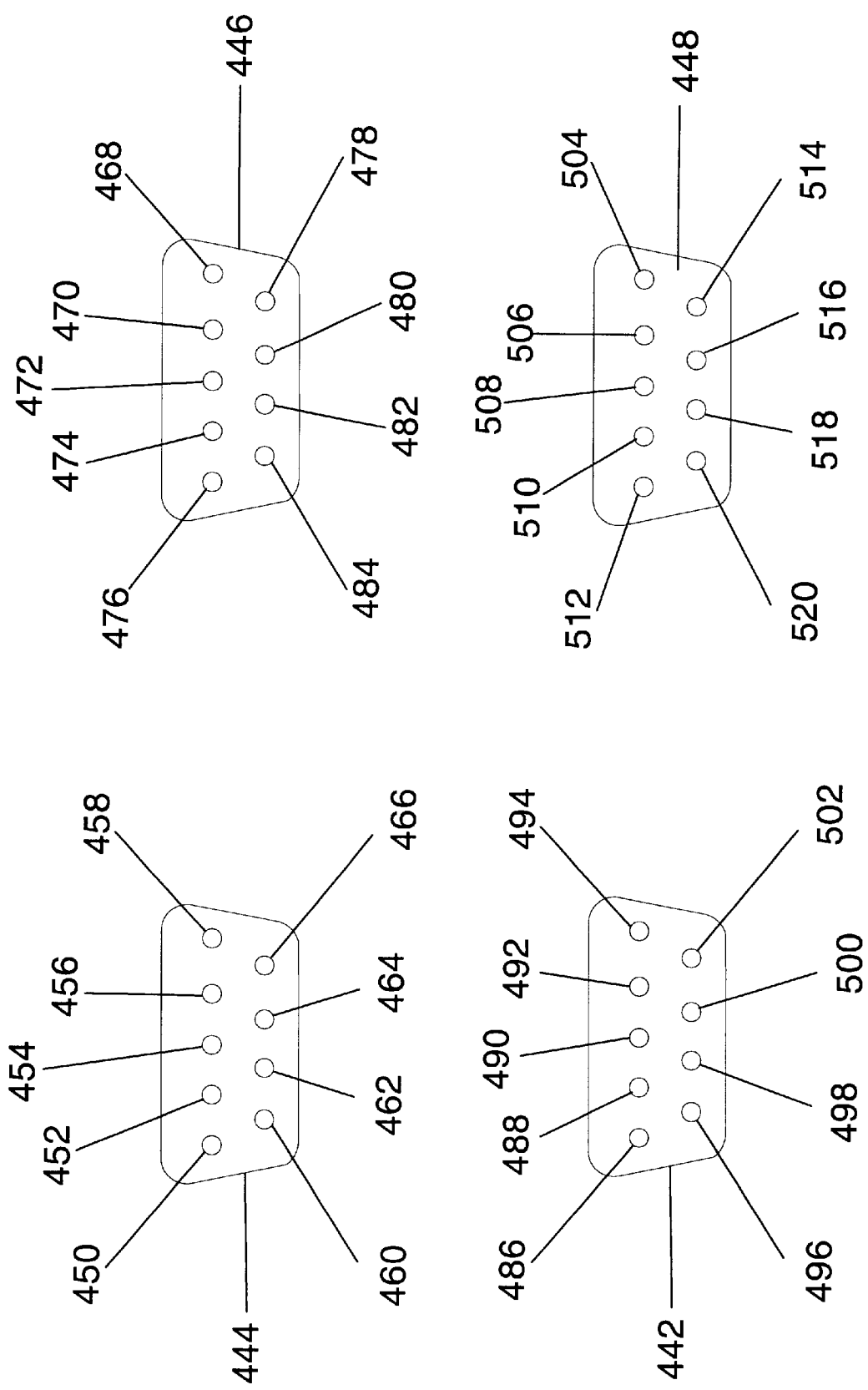
FIG. 10 shows the connectors used on the cable in FIG. 9.

FIG. 10 shows a position mapping for each of the connectors of the daisy chain cable 440. The following tables show the mapping of the positions:

| Position on connector for communications port and daisy chain 444 | Description | Position Connection |
| --- | --- | --- |
| Position 1 450 | EIA-RS-485 Tx+ | Connector 446 Position 1 468 and Connector 442 Position 1 486 |
| Position 2 452 | EIA-RS-232 TxD | Connector 446 Position 2 470 |
| Position 3 454 | EIA-RS-232 RxD | Connector 446 Position 3 472 |
| Position 4 456 | EIA-RS-485 Rx− | Connector 446 Position 4 474 and Connector 442 Position 4 492 |
| Position 5 458 | Ground | Connector 446 Position 5 476 and Connector 442 Position 5 494 |
| Position 6 460 | EIA-RS-485 Tx− | Connector 446 Position 6 478 and Connector 442 Position 6 496 |
| Position 7 462 | EIA-RS-485 Clock− | Connector 446 Position 7 480 and Connector 442 Position 7 496 |
| Position 8 464 | EIA-RS-485 Clock+ | Connector 446 Position 8 462 and Connector 442 Position 8 500 |
| Position 9 466 | EIA-RS-485 Rx+ | Connector 446 Position 9 484 and Connector 442 Position 9 502 |

| Position on connector for communications port and daisy chain 442 | Description | Position Connection |
| --- | --- | --- |
| Position 1 486 | EIA-RS-485 Tx+ | Connector 448 Position 1 504 and Connector 444 Position 1 450 |
| Position 2 488 | EIA-RS-232 TxD | Connector 448 Position 2 506 |
| Position 3 490 | EIA-RS-232 RxD | Connector 448 Position 3 508 |
| Position 4 492 | EIA-RS-485 Rx− | Connector 448 Position 4 510 and Connector 444 Position 4 456 |
| Position 5 494 | Ground | Connector 448 Position 5 512 and Connector 444 Position 5 458 |
| Position 6 496 | EIA-RS-485 Tx− | Connector 448 Position 6 514 and Connector 444 Position 6 460 |
| Position 7 498 | EIA-RS-485 Clock− | Connector 448 Position 7 516 and Connector 444 Position 7 462 |
| Position 8 500 | EIA-RS-485 Clock+ | Connector 448 Position 8 518 and Connector 444 Position 8 464 |
| Position 9 502 | EIA-RS-485 Rx+ | Connector 448 Position 9 520 and Connector 444 Position 9 466 |

Figure 11:
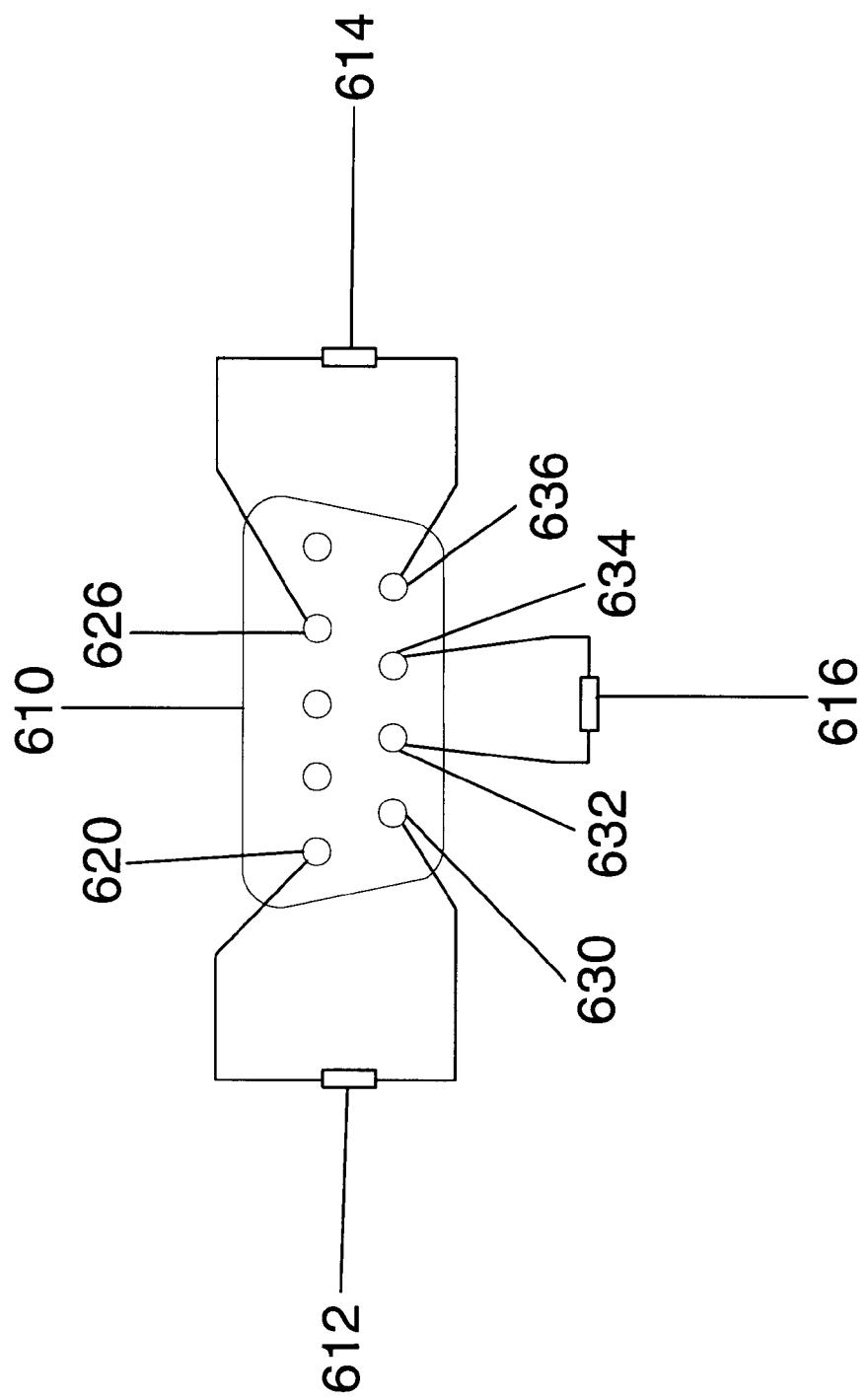
FIG. 11 shows a schematic view of a terminator used on the open end of the last cable used in a daisy chain of multiple control and monitoring systems.

FIG. 11 shows a schematic view of a terminator 610 used on the open end of the first and last cables in a daisy chain of multiple control and monitoring systems. A resistor 612 is connected to terminator position 1 620 and terminator position 6 630 such that when the terminator 610 is connected to communications port and termination connector 446, communications port and daisy chain connector 444 position 1 450 and communications port and daisy-chain connector 444 position 6 460 are terminated. A resistor 614 is connected to terminator position 4 626 and terminator position 9 636 such that when terminator 610 is connected to communications port and termination connector 446, communications port and daisy chain connector 444 position 4 456 and communications port and daisy chain connector 444 position 9 466 are terminated. A resistor 616 is connected to terminator position 7 632 and terminator position 9 634 such that when terminator 610 is connected to communications port and termination connector 446, communications port and daisy chain connector 444 position 7 462 and communications port and daisy chain connector 444 position 8 464 are terminated.

Figure 12B:
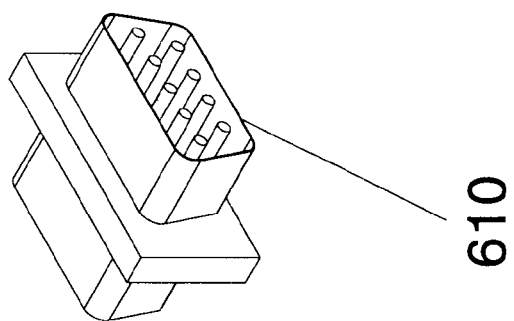
FIG. 12B shows a front view of the terminator in FIG. 11.
Figure 12A:
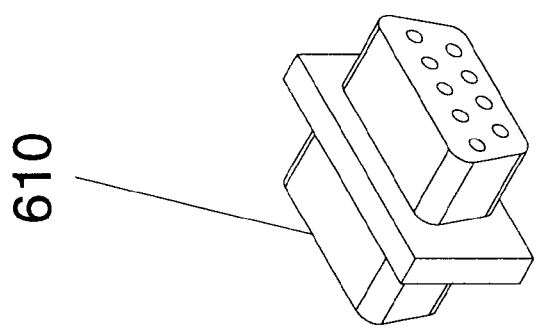
FIG. 12A shows a rear view of the terminator in FIG. 11.

FIG. 12A shows a rear view of the terminator and FIG. 12B shows a front view of the terminator. All positions on the front connector of the terminator are connected to each respective position on the rear connector of the terminator in a straight through fashion.

In the preferred embodiment, processors 232, 234, 236, 238, 240, 242, 244, 246, 296, and 370 are Atmel Corporation model AT89S8252 microcontrollers or equivalent; programmable logic devices 298 and 364 are Xilinx Corporation model XC9536 Complex Programmable Logic Devices (CPLDs) or equivalent; flash memory 308 is Atmel Corporation model AT29C020 or equivalent; NVRAM 302 is Dallas Semiconductor model DS1230AB-70 or equivalent; EIA-RS-232 Transmitter/Receiver 376 is Dallas Semiconductor model DS232 or equivalent;EIA-RS-485 Transceiver 378, 380, and 382 are Maxim Integrated Products model MAX485 or equivalent.

A compact disk comprising object code for the programmable logic and the microcontrollers is attached. The contest of the compact disc should be copied to following equipment should be copied to a floppy disk. The following equipment should be used when programming the programmable logic and the microcontrollers:

1) Laptop or PC running Windows (NT, Win95 or Win98) Operating System.
   2) Equinox Activ8r Programmer connected to the Laptop or PC's serial port via a serial straight-thru EIA-RS-232 DB9 female to DB9 male cable.
   3) A 10 conductor flat ribbon cable to perform in system programming (ISP).
   4) Equinox Meridian Suite programming software installed in the laptop or PC.
   5) Serial straight-thru EIA-RS-232 DB-9 female to DB-9 male cable to interconnect between the control and monitoring system and the Laptop or PC.
   6) Xilinx Foundation F1.5 software installed in the laptop or PC, to use the JTAG programmer program jtag-prog.exe.
   7) Xilinx Parallel Cable III Model DLC5 that connects to the laptop or PC.

The following procedure should be used in order to program the Programmable Logic, Programmable Logic 298 and 364 should be connected to a 6 pin JTAG connector in order to enable In System Programming from a programming device:
   1) Make sure the Xilinx Foundation F1.5's JTAG programmer is properly installed in the laptop or PC and that jtagprog.exe is in the execution path. Open an MSDOS Shell.
   2) Connect the DB-25 end of the Xilinx DLC5 Parallel Cable III to the laptop or PC's parallel port.
   3) Connect the 6 pin ribbon cable end of the Xilinx DLC5 Parallel Cable III to the Host Controller's Programmable Logic 364 to the 6 pin JTAG connector. Apply power to the control and monitoring system.
   4) On the laptop or PC in the MSDOS shell, change directory to the floppy diskette source and execute "proghost". Wait for operations of erase, program and verification of the Host Controller's Programmable Logic 364 and finally for the command prompt.
   5) Power down the control and monitoring system and move the 6 pin ribbon cable end of the Xilinx DLC5 Parallel Cable III from the Host Controller's Programmable Logic 364 JTAG header pins to the Main Controller's Programmable Logic 298 JTAG header pins. Apply power to the control and monitoring system.
   6) On the laptop or PC in the MSDOS shell, change directory to the floppy diskette source and execute "progmain". Wait for operations of erase, program and verification of the Main Controller's Programmable Logic 298 and finally for the command prompt. Power down the control and monitoring system and remove the 6 pin ribbon cable end of the Xilinx DLC5 Parallel Cable III from the Main Controller's Programmable Logic 298 JTAG header pins.

The following procedure should be used in order to program the Host Controller, processor 370 should be connected to a 10 pin ISP connector in order to enable In System Programming from a programming device:
   1) Connect the Activ8r programmer to the Host Controller, processor 370 to the 10 pin ISP connector via the 10 conductor flat ribbon cable. Be sure to jumper the programmer to use its own external power source, instead of the target's. Apply power to the programmer unit and to the control and monitoring system.
   2) Run Meridian programmer software and initialize the programmer hardware via the serial port for flashing the Host Controller, processor 370. Load into the buffer the AdmCtrl.hex code from the floppy diskette source. Erase the Host Controller, processor 370 and then program it with the data from the program buffer.
   3) Power down the control and monitoring system and remove the interconnecting ISP cable.

The following procedure should be used in order to program the Main Controller, processor 296 and Port Controllers, processors 232,234,236, 238,240,242,244, and 246:
   1) Power up the control and monitoring system. Connect the serial EIA-RS-232 cable between the DB9 serial port 12 and the Laptop or PC's serial port.
   2) Insert the source diskette to Laptop or PC, run CPDnld and use it to communicate with the Host Controller, processor 370 via the DB9 serial port 12.
   3) Login with a predetermined password. The following password could be used: "System Administrator".
   4) Download to the internal flash EPROM of the Main Controller, processor 296 with the OperDnld.hex code from the floppy diskette source.
      (a) To the "?" prompt type "Ctrl ]" which will invoke the command mode.
      (b) To the "Cmd:" prompt type "d"
      (c) To the "Enter filename:" prompt type "a:\OperDnld.hex"
      (d) To the "Enter destination (D=OperInternal, E=Port, F=OperFlashEPROM or G=OperNVRAM)" prompt type "D".
      (e) After completion of the download process, to the "Cmd:" prompt type "r" to return to terminal mode.
      (f) Type Enter key to elicit a "?" prompt from the Administrator software.
   5) Download to one of the internal flash EPROM of one of the Port Controllers, processors 232,234,236,238, 240,242,244,246 with the PortCtrl.hex code from the floppy diskette source.
      (a) To the "?" prompt type "Ctrl ]" which will invoke the command mode.
      (b) To the "Cmd:" prompt type "d"
      (c) To the "Enter filename:" prompt type "a:\:PortCtrl.hex"
      (d) To the "Enter destination (D=OperInternal, E=Port, F=OperFlashEPROM or G=OperNVRAM)" prompt type "E".
      (e) After completion of the download process, to the "Cmd:" prompt type "r" to return to terminal mode.
      (f) Type Enter key to elicit a "?" prompt from the Administrator software.
   6) Download to the Operation processor's external flash EPROM with the OperCtrl.hex code from the floppy diskette source.
      (a) To the "?" prompt type "I" to switch to internal Operation code memory.
      (b) To the "?" prompt type "Ctrl ]I" which will invoke the command mode.
      (c) To the "Cmd:" prompt type "d"
      (d) To the "Enter filename:" prompt type "a:\OperCtrl.hex"
      (e) To the "Enter destination (D=OperInternal, E=Port, F=OperFlashEPROM or G=OperNVRAM)" prompt type "F".
      (f) After completion of the download process, to the "Cmd:" prompt type "r" to return to terminal mode.
      (g) Type Enter key to elicit a "?" prompt from the Administrator software.
   7) Download to the Operation processor's NVRAM with the DefNVRAM.hex code from the floppy diskette source.

(h) To the "?" prompt type "I" to switch to internal Operation code memory.
(i) To the "?" prompt type "Ctrl ]" which will invoke the command mode.
(j) To the "Cmd:" prompt type "d"
(k) To the "Enter filename:" prompt type "a:\DefNVRAM.hex"
(l) To the "Enter destination (D=OperInternal, E=Port, F=OperFlashEPROM or G=OperNVRAM)" prompt type "G".
(m) After completion of the download process, to the "Cmd:" prompt type "r" to return to terminal mode.
(n) Type Enter key to elicit a "?" prompt from the Administrator software.

7) Reset the control and monitoring system by powering down and then waiting for a few seconds before powering up and the unit should be ready to operate for its designed function.

Operation of Invention

Each computer to be controlled and monitored is connected to the control and monitoring system via a Keyboard-Video-Mouse (KVM) Cable 100. A keyboard connector 106 plugs into the keyboard port of the computer to be controlled and monitored. A mouse connector 108 plugs into the mouse port of the computer to be controlled and monitored. A video connector 104 plugs into the video port of the computer to be controlled and monitored. A KVM connector 102 plugs into one of the KVM ports 20, 22, 24, 26, 28, 30, 32, 34, 36, 38, 40, 42, 44, 46, 48, 50.

The processor 296 communicates with the processor 370 via the data path 320. The processor 370 can also communicate with a computer attached to the communications port 12 via a modem cable or via a null modem cable and a modem. The processor 370, also known as the Host Controller, also looks for EIA-RS-232 Receive Data signals 386 coming from the EIA-RS-232 Transmitter/Receiver 376 and passes the Receive Data signal 390 to the processor 370. The processor 370 can send acknowledgements or other data via EIA-RS-232 Transmit Data signal 386 to the EIA-RS-232 Transmitter/Receiver 376 which then passes EIA-RS-232 Transmit Data signals 384.

The computer attached to communications port 12 may transmit any of several commands, including but not limited to:

Print the available commands menu
Login and establish an administration (admin) session
Logout from admin session
Reset the entire system
Read current configuration settings
Set configuration settings
Switch operating software between internal flash memory on the processor 296 and flash memory 308.
Perform diagnostic tests
Set local options
  Select the Port Controllers that will be active in subsequent operations of erase, program, and upload.
Switch the execution of processor 296 (also known as the Main Controller)—between internal flash memory and flash memory 308
Erase internal flash memory on the processor 296, flash memory 308, or any or all of the Port Controllers' flash memory.
Download code and data and program internal flash memory on the processor 292, flash memory 308, or for any or all of the Port Controllers' flash memory.
Download code and data to NVRAM 302
Upload code and data from flash memory of processor 292, flash memory 308, or any or all of the Port Controllers flash memory.
Upload code and data from NVRAM 302
Turn LCD +12V power on and off
Turn Debug LED on and off
Send commands and/or data to processor 296 (also known as the Main Controller)
Get status and/or data from processor 296 (also known as the Main Controller)
Submit any of the above to another control and monitoring system connected to communications port 12 via at least one daisy chain cable 440.

Once the Host Controller receives one of the above commands it processes it and looks for more commands from the remote computer communicating through the communications port 12.

Red, Green, Blue, Horizontal Sync, and Vertical Sync (RGBHV) Signals 326, 328, 330, 332, 334, 336, 338, 340, 342, 344, 346, 348, 350, 352, 354, 356 are received by the video switch 324. A video select signal 322 causes the video switch 324 to pass Red, Green, and Blue video signals 362 to a video driver 420. The video select signal 322 also causes the video switch 324 to pass Horizontal and Vertical Sync signals to a Programmable Logic 364.

The processor 370, also known as the Host Controller, takes the local Horizontal Sync generated by Programmable Logic 364, generates the local Vertical Sync and passes to the Programmable Logic 364. The processor 296, also known as the Main Controller passes data over the data path 366 for on screen menu display to the video driver 420. Red, Green, and Blue video signals are overlaid with on screen menu display data, if any, and a set of amplified Red, Green, Blue, Horizontal Sync, and Vertical Sync video signals 422 are sent to video port 10. A set of amplified Red, Green, Blue, Horizontal Sync, and Vertical Sync video signals 424 are sent to video port 54.

The processor 296, also known as the Main Controller also checks to see if Vertical Sync signal 358 and Horizontal Sync signal 360 are being provided by one of the remote computers through the video switch 324. If there are no such signals, the Main Controller enables the local Vertical Sync and Horizontal Sync signals and passes Horizontal Sync and Vertical Sync signals 367 and instructs programmable logic device 364 to pass said signals to the video driver 420.

The processor 370 also communicates with other Host Controllers on other control and monitoring units via a daisy chain cable 440 connected to the communications port 12 of each control and monitoring unit.

The processor 296, also known as the Main Controller controls and monitors eight processors 232, 234, 236, 238, 240, 242, 244, 246. The Programmable Logic 298 provides the processor 296 with code for being able to communicate with the processor 370 and also the other eight processors 232, 234, 236, 238, 240, 242, 244, 246.

The Main Controller looks for and processes commands from the Host Controller. Commands coming from the Host Controller include but are not limited to:
Get the current status
Perform the following diagnostic tests:
  Select video port 1–16 through the video switch
  Enable and disable video port
  Turn on and off Horizontal Sync and Vertical sync
  Enable and disable video driver
  Show graphics window while measuring the horizontal sync and vertical sync signals Download code and data and program the flash memory 308 or NVRAM 302

Upload code and data from flash memory 308 or NVRAM 302

Erase flash memory 308

Verify code in flash memory 308

Turn LCD +12V power on and off

Turn Debug LED on and off

Echo data back

The Main Controller also performs the following tasks as dictated by the program loaded from flash memory 308:

Presents the selected port number or system name associated with the port number on the display 68

As keyboard signals 316 and mouse signals 318 are received into processor 296, the Main Controller detects such a condition and does the following:

Reads the keyboard and mouse data

Checks to see if the menu entry key has been typed. The menu entry key is a predetermined character sequence. For example, either the "Print Screen" or "Pause" keys could be used to trigger the on screen menu. Other keys to invoke the on screen menu may also be designated by a human user.

If the menu entry key has not been typed, the keyboard and mouse data is passed to the currently selected KVM port through the appropriate Port Controller.

If the menu entry key has been typed, the Main Controller performs the following:

Set currently selected port to DESELECTED to Port Controller

Present a Main menu on screen

Process the Main menu commands in the following manner until an exit or cancel command or a timeout is received:

Present the selected port number on screen

Look for a menu command

If an Exit command or a timeout is received then

Re-initialize the keyboard 72 and the touchpad 70 to the currently selected-port states. For example, the state of the mouse scaling and resolution.

Re-initialize any keyboard attached to keyboard port 14 to the currently selected port states. For example, the state of "Num Lock" or "Caps Lock".

Re-initialize any pointing device attached to mouse port 16 to the currently selected port states.

Remove the menu from the screen and show the currently selected port's video.

If a Set Selected Port command is received then the user is allowed to select a port using the number keys, function keys, or cursor keys on the keyboard and then confirm the selection with the Enter key on the keyboard. The state of the selected port is set to SELECTED and it informs the associated Port Controller and the Exit command is processed as described above.

If an About command is received then show company's current information, version, and copyright information and wait for Main menu or Exit commands. If the Main menu command is received then return to the Main menu. If the Exit command is received then process it as described above.

If a Detail command is received then show information for the first eight KVM ports 20, 22, 24, 26, 28, 30, 32, and 34. Information includes the port number, name associated with the port, and whether the port is marked ACTIVE or INACTIVE. The menu code then waits for a command and processes it as follows:

If the Main menu command is received the Main menu is displayed.

If the Exit command or a timeout is received it is processed as described above.

If a Next command is received then show information for the next eight KVM ports 36, 38, 40, 42, 44, 46, 48, and 50. Information includes the port number, name associated with the port, and whether the port is marked ACTIVE or INACTIVE. Then menu code then waits for a command and processes it as follows:

If the Main menu command is received the Main menu is displayed.

If the Exit command is received it is processed as described above.

If a Previous command is received it is processed as the Detail command described above.

If a Setup command is received then process commands in the following manner:

Disable timeout on waiting for input

Display the Setup menu

If an Exit command is received then process it as described above

If a Discard Setup command is received then return to the Main menu without saving any changes.

If an Edit Ports 1–8 command is received then display information about KVM ports 20, 22, 24, 26, 28, 30, 32, and 34 and allow the user to type in a system name and description associated with the port using the arrow keys and character keys. If a Previous command is selected with the arrow keys or page up key then return to the Setup menu. If an Exit command is selected process it as described above.

If an Edit Ports F1–F8 command is received then display information about KVM ports 36, 38, 40, 42, 44, 46, 48, and 50 and allow the user to type in a system name and description associated with the port using the arrow keys and character keys. If a Previous command is selected with the arrow keys or page up key then return to the Setup menu. If an Exit command is selected process it as described above.

If a Save Setup command is received then request the user to enter the password. If the password matches the currently saved password then update and save the settings to flash memory 308 and return to Main menu. If the password does not match then return to the Setup menu.

If a Change Password command is received then request the user to enter the currently saved password. If the password does not match then return to the Setup menu. If the password matches the saved password then allow the user to enter a new password twice. If the two new passwords match then save it to flash memory 308 and return to the Main menu. If the two new passwords do not match then repeat the Change Password process.

Polls the Port Controller for the selected port for new changes in keyboard and mouse states and status.
  If new keyboard states and status are available from the KVM port they are sent to the keyboard 72 and the external keyboard port 14.
  If new mouse states and status are available from the KVM port they are sent to the touchpad 70 and the external mouse port 16.

If no keyboard or mouse "connected" signals are detected from the KVM port for a specified period of time then the Port Controller will mark the port INACTIVE and return such status. Poll the Port Controller for ports marked as ACTIVE ports
  If new states and status are available then update the states of the port and mark it as ACTIVE
  If no keyboard or mouse "connected" signals are detected from the KVM port for a specified period of time then that port is marked INACTIVE Poll the Port Controller for ports marked as INACTIVE ports
  If keyboard or mouse "connected" signals are detected from the KVM port for a specified period of time then mark the status for the port as ACTIVE
  If no keyboard or mouse "connected" signals are detected from the KVM port for a specified period of time then keep the status for the port as INACTIVE Any of the eight processors 232, 234, 236, 238, 240, 242, 244, 246 are also known as a Port Controller.

Each Port Controller sends and receives keyboard and mouse data between the Main Controller and each of two KVM ports. Each Port Controller performs the following tasks in a loop:

Check for keyboard or mouse data from the Main Controller
If the keyboard or mouse data is for one of the two KVM ports connected to the Port Controller then send the keyboard and mouse data through the appropriate KVM port.
Check for a request for status from the Main Controller
If a request for status from the Main Controller is received then send the keyboard or mouse states and the status of either ACTIVE or INACTIVE for the KVM port to the Main Controller.
Check for keyboard or mouse data from the KVM ports
If there is keyboard or mouse data from the KVM ports then process it, save the state such as Num Lock, Caps Lock and send the appropriate responses back through the KVM ports. Such states are sent back to the keyboard or mouse on the next poll from the Main Controller.
Poll to see if there is a computer that is asserting the keyboard and mouse "connected" signals going to each of the two KVM ports. If there is a connection within a specified period of time then mark the port as ACTIVE. If there is no connection within a specified period of time then mark the port as INACTIVE.

Multiple control and monitoring systems may be daisy chained together. The first control and monitoring system is designated as a Master System. Each additional control and monitoring system is referred to as a Slave System. A connector for communications port and daisy chain 444 of a daisy chain cable 440 plugs into the communications port 12 of the Master System. A connector for communications port and daisy chain 442 plugs into the communications port 12 of a Slave System. Additional slave systems are added by connecting a connector for communications port and daisy chain 444 of an additional daisy chain cable 440 into the connector for communications port and termination 448 of a Slave System at the end of the daisy chain and plugging the connector for communications port and daisy chain 442 of the communications cable 440 into the communications port 12 of the Slave System to be added. The first and last daisy chain cable in the daisy chain requires a terminator 610 on the communications port and termination connector 446 or 448. A KVM Cable 100 also connects each Slave System to the Master System. The keyboard connector 106 is plugged into the external keyboard port 14 of a Slave System. The mouse connector 108 is plugged into the external mouse port 16 of the Slave System. The video connector 104 is plugged into the external video port 10 of the Slave System. The KVM connector 102 plugs into one of the KVM ports 20, 22, 24, 26, 28, 30, 32, 34, 36, 38, 40, 42, 44, 46, 48, 50 of the Master System.

The Master System and Slave Systems communicate over the daisy chain cables 440 using the Serial Peripheral Interface (SPI) protocol as documented in "Microcontroller Data Book, AT86 Series" published December 1997 by Atmel Corporation. The MOSI signal called out in the data book is seen here as an RS-485 Tx signal pair (Tx+, Tx−). The MISO signal called out in the data book are seen here as the RS-485 Rx signal pair (Rx+,Rx−). The SCK signal called out in the data book is seen here as the RS-485 Clock signal pair (Clock+,Clock−). The Master System uses the single-ended Transmit/Receive Data signal 398 to transmit data via EIA-RS-485 Transceiver 378. The EIA-RS-485 Transceiver 378 transmits data to Slave Systems using the Differential Transmit/Receive Data High signal 392 and the Differential Transmit/Receive Data Low signal 396.

A Slave System uses the single-ended Transmit/Receive Data signal 398 to receive data via EIA-RS-485 Transceiver 378. The EIA-RS-485 Transceiver 378 receives data from the Master System using the Differential Transmit/Receive Data High signal 392 and the Differential Transmit/Receive Data Low signal 396.

The Master System uses the single-ended Receive/Transmit Data signal 406 to receive data via EIA-RS-485 Transceiver 380. The EIA-RS485 Transceiver 380 receives data from Slave Systems using the Differential Receive/Transmit Data High signal 400 and the Differential Receive/Transmit Data Low signal 404.

A Slave System uses the single-ended Receive/Transmit Data signal 406 to transmit data via EIA-RS485 Transceiver 380. The EIA-RS485 Transceiver 380 transmits data to the Master System using the Differential Receive/Transmit Data High signal 400 and the Differential Receive/Transmit Data Low signal 404.

The Master System uses the single-ended Clock signal 414 to transmit a clock signal to an EIA-RS485 Transceiver 382. The EIA-RS485 Transceiver 382 transmits a differential clock signal to a Slave System using the Differential Clock High signal 408 and the Differential Clock Low signal 412.

A Slave System receives a single-ended clock signal from the EIA-RS485 Transceiver 382 through the Clock signal 414. The EIA-RS485 Transceiver 382 receives a differential clock signal from the Master System through the Differential Clock High signal 408 and the Differential Clock Low signal 412.

The Master System and Slave Systems communicate with each other through cascade signals using the SPI protocol. The Master System is always in control and through one of its KVM ports 20, 22, 24, 26, 28, 30, 32, 34, 36, 38, 40, 42, 44, 46, 48, 50 it can display the video from a Slave. System port 10 and control the keyboard port 14 and mouse port 16 of the Slave System. Switching KVM ports in the Master System is equivalent to switching groups of computers, each group of computers being attached to a Slave System. The control menu in the Master System allows the switching and selection of one of the KVM ports 20, 22, 24, 26, 28, 30, 32, 34, 36, 38, 40, 42, 44, 46, 48, 50, each of which could represent KVM ports 20, 22, 24, 26, 28, 30, 32, 34, 36, 38, 40, 42, 44, 46, 48, 50 on a Slave System or a combination of groups of computers and individual computers. Once a group is selected the Master System can use cascade signals to command the group associated with the Slave System to display its port selection and allow a specific KVM port on the Slave System to be connected. The process described saves an additional step of having to first select a KVM port on the Master System and then select a KVM port on the Slave System. The use of cascade signals also provides a way to transfer configuration and operational state information from Slave Systems to the Master System for improved user interface and quick access to each KVM port's status information. Thus, the combination of Master Systems and Slave Systems appear to function as one large control and monitoring system.

Additional Embodiments

An additional embodiment is one where the control and monitoring system may be mounted vertically on the side of a rack instead of being mounted horizontally in the rear of a rack.

Another embodiment utilizes the keyboard-video-mouse switch and a plurality of keyboard-video-mouse cables without the keyboard, pointing device, and video display. Such an embodiment would allow connection to other keyboard-video-mouse switches in a tiered fashion whereby a video display output port of a first keyboard-video-mouse switch is connected to a video display input port of a second keyboard-video-mouse switch, a keyboard input port of the first keyboard-video-mouse switch is connected to a keyboard output port of the second keyboard-video-mouse switch, and a mouse input port of the first keyboard-video-mouse switch is connected to a mouse output port of the second keyboard-video-mouse switch. In addition the cascade signals between the Systems would improve the user interface of the controlling Master system with the video display, keyboard and mouse devices.

Alternative Embodiments

An alternative embodiment comprises processor equivalents such as Central Processing Units (CPUs) instead of processors.

There are various possibilities with regard to the pointing device and video display. The pointing device could be a trackball, graphics tablet, joystick, or mouse. The video display and pointing device could be combined into a touchscreen device.

Another alternative embodiment comprises a KVM switch capable of being daisy chained such that a plurality of interconnected KVM switches appears to be a single switch with more ports than a single KVM switch to a human user.

Advantages

From the description above, a number of advantages of the control and monitoring system become evident:

Rack space required for video display, character input, and pointing device is kept to a minimum.

The number of separate connectors required to connect a system to a KVM switch is reduced from three (3) to one (1), reducing the likelihood of a failure due to a loose connection caused by stress on an individual cable.

The video display, character input device, and pointing device of the control and monitoring system may extend out of a rack as a single unit. Traditional solutions to control and monitor multiple computer systems require a human user to extend a keyboard drawer. The video display in such solutions had to be extended separately or mounted flush with the rack and consuming valuable vertical rack space. Alternatively, a video display attached to a keyboard drawer by a hinge could be extended out of a rack with a keyboard and pointing device but consumed 2U (3.50 inches) of vertical rack space.

An external control port on the opposite side allows a second video display, character input device, and pointing device to be connected to the control and monitoring system. This is useful in a trade show environment where a computer video display output may be sent to a video projection system or line driver and a remote control device may be used to control character input or pointing input or both character input and pointing input.

A plurality of control and monitoring systems may be daisy chained together in a tiered fashion whereby a human user may access multiple control and monitoring systems as well as the systems connected to the control and monitoring systems from a single control and monitoring system. Traditional KVM switches may be daisy chained but the number of KVM switches that may be connected is limited.

The control and monitoring system may switch off power to the video display after a period of time has elapsed, reducing power consumption and thermal emissions when the control and monitoring system has not been utilized for a specified period of time.

A minimum of one processing unit for every two ports on the control and monitoring system allows the control and monitoring system to sample each computer connected to the control and monitoring system for video display independent of the other ports on the control and monitoring system, reducing the likelihood of losing data at a critical time. Another processor reduces the likelihood of losing character input or pointing input to the control and monitoring system from a human user by independently sampling for character input and pointing input.

The video display, character input device, and pointing device are protected from dust and impact from objects when the control and monitoring system is in the closed position.

No special software or hardware is required to be installed on the computer that is being controlled, other than a cable which has a single connector on one end and connectors for video display, character input, and pointing input on the other end.

CONCLUSION, RAMIFICATIONS, AND SCOPE OF INVENTION

Accordingly, the reader will see that the control and monitoring system of this invention allows a user to apply input to and view the video display output of multiple computer systems. Loss of data is prevented by utilizing multiple processors to handle keyboard and mouse signals and to pass video signals through a video switch. The control and monitoring system may be restarted by a remote operator or have its programming downloaded or uploaded to a remote computer system, easing the job of troubleshooting and maintenance of upgrades. The control and monitoring system consumes a minimum of space by removing the need for separate mini-DIN connectors for keyboard and mouse signals on the control and monitoring system side and using a single fifteen position D-sub connection for keyboard, mouse, and video display signals. Furthermore, the control and monitoring system has the additional advantages of:

(a) allowing more than the eight (8) systems currently allowed by current keyboard-video-mouse (KVM) switches while consuming the same amount of vertical rack space as a conventional KVM switch;

(b) providing a video display, a character input device, and a pointing device which consumes a minimum of vertical rack space;

(c) allowing connection to other control and monitoring systems in a tiered fashion so more than sixteen (16) systems may be controlled and monitored.

Although the description above contains many specificities, these should not be construed as limiting the scope of the invention but as merely providing illustrations of some of the presently preferred embodiments of this invention. For example, the control and monitoring system can use more processors; more than sixteen (16) ports could be used; a different pointing device could be used, etc. Thus the scope of the invention should be determined by the appended claims and their legal equivalents, rather than by the examples given.

What is claimed:

1. A control and monitoring system for a plurality of computers comprising:

(a) a keyboard-video-mouse switch comprising a plurality of first connectors, each of which is connected to:

(b) a keyboard-video-mouse cable which accepts unmodified signals and does not require additional devices between said computer and said switch, said cable comprising:

(i) a first end comprising a second connector for connecting into said keyboard-video-mouse switch; and (ii) a second end comprising:

(1) a third connector for connecting into a keyboard port of a computer, (2) a fourth connector for connecting into a pointing device port of said computer, and (3) a fifth connector for connecting into a video port of said computer, whereby said keyboard-video-mouse cable carries keyboard signals, pointing device signals, and red, green, blue, vertical sync, and horizontal sync video signals between said computer and said keyboard-video-mouse switch.

2. A control and monitoring system for a plurality of computers comprising:

(a) a keyboard-video-mouse switch in a stationary configuration; and (b) an input and display device comprising:

(i) a base housing comprising a keyboard and pointing device and (ii) a display housing pivotably connected to the base housing in a configuration such that the display housing at least partially covers and protects the base housing when in a closed position, wherein said input and display device is slidably connected to, and in communication with, said keyboard-video-mouse switch such that said input and display device may be stored or extended to an open position while said keyboard-video-mouse switch remains in a fixed position, thereby reducing the likelihood of a cable being pulled loose by a human operator during an extending or storing operation.

3. The control and monitoring system of claim 2 wherein said input and display device has a maximum vertical height of 1.75 inches when in a stored position.

4. The control and monitoring system of claim 2 further comprising an arm comprising a plurality of hinges and a first end joined to said input and display device and a second end joined to said keyboard-video-mouse switch, wherein cables connected between said input and display device and said keyboard-video-mouse switch may be fastened to said arm to minimize the possibility of cable pinching as a human operator slides the input and display device mounted in a computer equipment rack from a storage position to an open position.

5. The control and monitoring system of claim 1, wherein said second connector comprises a fifteen position D-sub connector and each of said plurality of first connectors comprises a fifteen position D-sub connector.

6. The control and monitoring system of claim 1, wherein said second connector comprises a fifteen position DB 15 connector and each of said plurality of first connectors comprises a DB 15 connector.

7. The control and monitoring system of claim 1, wherein the plurality of first connectors comprises at most sixteen connectors.

8. A control and monitoring system comprising:

(a) a plurality of first processors for processing keyboard and pointing device signals from a plurality of computers, wherein each first processor interfaces to not more than two computers; and (b) a second processor in communication with a character input device and a pointing device and in communication with each of said plurality of first processors, for processing keyboard signals from said character input device and pointing device signals from said pointing device to each of said plurality of first processors; and (c) a first programmable logic device in communication with said second processor; and (d) a non-volatile random access memory electrically to in communication with said second processor and in communication with said first programmable logic device; and (e) a video driver in communication with a second programmable logic device and in communication with said second processor, for displaying an on screen menu or a set of video signals from each of said plurality of computers; and (f) a video switch in communication with said second processor, for receiving a plurality of red, green, blue, horizontal and vertical sync video signals from each of said plurality of computers and sending each of said plurality of red, green, blue, horizontal and vertical sync video signals to said video driver.

9. The system of claim 8 wherein said video driver comprises:

(a) an on screen graphics display circuit, for generating text and graphics for an on screen menu; and (b) an on screen graphics overlay circuit coupled to said on screen graphics display circuit and said video switch; and (c) a plurality of first op-amp amplifying circuits coupled to said on screen graphics overlay circuit, one each for each of a plurality of red video signals from said on screen graphics overlay circuit; and (d) a plurality of second op-amp amplifying circuits coupled to said on screen graphics overlay circuit, one each for each of a plurality of green video signals from said on screen graphics overlay circuit; and (e) a plurality of third op-amp amplifying circuits coupled to said on screen graphics overlay circuit, one each for each of a plurality of blue video signals from said on screen graphics overlay circuit; and (f) a first signal splitting circuit coupled to said video switch, for passing a plurality of vertical sync signals from said programmable logic means; and (g) a second signal splitting circuit coupled to said video switch means, for passing a plurality of horizontal sync signals from said logic means,
whereby a plurality of video display devices may be sent video signals to drive said plurality of video display devices.

10. The system of claim 8 wherein said each of said plurality of first processors comprises a microcontroller.

11. The system of claims 8 wherein said second processor comprises a microcontroller.

12. The system of claim 8 further comprising:
(a) a plurality of first connectors connected to said video driver, for a plurality of video display devices viewable by a human operator; and
(b) a plurality of second connectors connected to said second processor, each of said plurality of third connectors may be connected to one of a plurality of character input devices which said human operator can use to send a series of characters to said second processor means; and
(c) a plurality of fourth connectors connected to said second processor, whereby each of said plurality of fourth connectors may be connected to one of a plurality of pointing devices which said operator can manipulate to point to any location on one of said plurality of video display means.

13. The system of claim 8 further comprising:
(a) a third processor electrically connected to said first processor, for uploading and downloading programming and data and processing commands from a remote computer; and
(b) said second programmable logic device electrically connected to said third processor, said video switch, and said video driver; and
(c) a communications interface connected to said third processor, for providing commands, programming, and data to said third processor from said remote computer, whereby said remote computer may send commands and upload and download programming and data to said third processor.

14. The system of claim 8 wherein said first programmable logic device comprises a Complex Programmable Logic Device; and said second programmable logic device comprises a Complex Programmable Logic Device.

15. The system of claim 13 wherein said communications interface comprises:
(a) a Transmitter/Receiver connected to said third processor for receiving data and transmitting data between said third processor and a remote computer,
whereby said third processor receives commands, programming, and data from said remote computer and transmits programming and data to said remote computer.

16. A control and monitoring system for a plurality of computers comprising:
(a) a first keyboard-video-mouse switch; and
(b) at least one second keyboard-video-mouse switch;
(c) a first Transceiver coupled to said first keyboard-video-mouse switch for transmitting and receiving differential data signals between said first keyboard-video-mouse switch and said second keyboard-video-mouse switch;
(d) a second Transceiver coupled to said first keyboard-video-mouse switch for receiving and transmitting differential data signals between said first keyboard-video-mouse switch and said second keyboard-video-mouse switch;
(e) a third Transceiver coupled to said first keyboard-video-mouse switch for asserting and receiving differential clock signals between said first keyboard-video-mouse switch and said second keyboard-video-mouse switch;
(f) a fourth Transceiver coupled to said second keyboard-video-mouse switch for transmitting and receiving differential data signals between said second keyboard-video-mouse switch and said first keyboard-video-mouse switch;
(g) a fifth Transceiver coupled to said second keyboard-video-mouse switch for receiving and transmitting differential data signals between said second keyboard-video-mouse switch and said first keyboard-video-mouse switch;
(h) a sixth Transceiver coupled to said second keyboard-video-mouse switch for asserting and receiving differential clock signals between said second keyboard-video-mouse switch and said first keyboard-video-mouse switch; and
(i) a daisy chain cable comprising:
(1) a first end connected to said first keyboard-video-mouse switch, and
(2) a second end connected to one-of said second keyboard-video-mouse switch on the other end,
wherein a plurality of control and monitoring systems may communicate with each other.

17. The system of claim 16 wherein said daisy chain cable comprises:
(a) a first head comprising a connector, for connecting into said first keyboard-video-mouse switch; and
(b) a second head in comprising a connector, for connecting a terminator or a communications cable for a computer; and
(c) a third head comprising a connector, for connecting into said second keyboard-video-mouse switch; and
(d) a fourth head comprising a connector, for connecting into said first connector of another daisy chain cable or a terminator,
wherein said first head is connected to said second head; and said second head is connected to said third head; and said third head is connected to said fourth head; and whereby a plurality of control and monitoring systems may be daisy chained together.

* * * * *

US006609034C1

(12) INTER PARTES REEXAMINATION CERTIFICATE (0213th)
United States Patent
Behrens et al.

(10) Number: US 6,609,034 C1
(45) Certificate Issued: Nov. 30, 2010

(54) SYSTEM AND METHOD FOR REMOTELY CONTROLLING AND MONITORING A PLURALITY OF COMPUTER SYSTEMS

(75) Inventors: Edward Behrens, Laguna Niguel, CA (US); Tho Tu, Laguna Niguel, CA (US); Van Hua, San Jose, CA (US); David Wang, San Jose, CA (US); John Goodin, Coto de Caza, CA (US); Robert Matthes, San Clemente, CA (US)

(73) Assignee: Epicenter, Incorporated, San Jose, CA (US)

Reexamination Request:
No. 95/000,181, Nov. 14, 2006

Reexamination Certificate for:
Patent No.: 6,609,034
Issued: Aug. 19, 2003
Appl. No.: 09/538,063
Filed: Mar. 29, 2000

(51) Int. Cl.
*G05B 15/00* (2006.01)

(52) U.S. Cl. .............. 700/19; 361/679.1; 361/679.4; 700/1; 700/17; 700/20; 700/83; 709/200; 709/201; 710/303; 710/304; 710/305

(58) Field of Classification Search .................. None
See application file for complete search history.

(56) References Cited

U.S. PATENT DOCUMENTS

| | | | |
|---|---|---|---|
| 4,614,383 A | 9/1986 | Polley et al. | |
| 4,782,245 A | * 11/1988 | Henry | ............ 307/147 |
| 5,055,996 A | 10/1991 | Keslowitz | |
| 5,388,052 A | 2/1995 | Mann | |
| 5,416,666 A | 5/1995 | Maguire, Jr. | |
| 5,443,312 A | 8/1995 | Schluter | |
| 5,465,105 A | 11/1995 | Shatas et al. | |
| 5,721,842 A | 2/1998 | Beasley et al. | |
| 5,801,921 A | 9/1998 | Miller | |
| 5,978,389 A | 11/1999 | Chen | |
| 6,007,372 A | 12/1999 | Wood | |
| 6,137,455 A | 10/2000 | Duo | |
| 6,142,590 A | 11/2000 | Harwell | |
| 6,160,543 A | 12/2000 | Chen | |
| 6,175,502 B1 | 1/2001 | Schaerer et al. | |
| 6,185,092 B1 | 2/2001 | Landrum et al. | |
| 6,210,211 B1 | 4/2001 | Landrum et al. | |
| 6,231,379 B1 | 5/2001 | Shen | |
| 6,256,014 B1 | 7/2001 | Thomas et al. | |
| 6,280,243 B1 | 8/2001 | Liu et al. | |
| 6,303,864 B1 | 10/2001 | Johnson et al. | |
| 6,324,605 B1 | 11/2001 | Rafferty et al. | |
| 6,353,532 B1 | 3/2002 | Landrum et al. | |
| 6,356,793 B1 | 3/2002 | Martin | |
| 6,378,009 B1 | 4/2002 | Pinkston, II et al. | |

(Continued)

FOREIGN PATENT DOCUMENTS

| | | |
|---|---|---|
| KR | 10-1998-0032818 | 3/2000 |
| WO | WO 99/18580 | 4/1999 |

OTHER PUBLICATIONS

Signum Plus XB, Users Manual for Signal Multiplexer (Feb. 1998).

(Continued)

*Primary Examiner*—Minh T Nguyen

(57) ABSTRACT

An improved control and monitoring system for managing more than one computer system using a witch with a single connector for keyboard, video and mouse signals for each computer being managed. A notebook style display, keyboard, and pointing device attached to the switch provide a human interface. Each computer is attached to the switch using a cable having a single connector at the attachment point to the switch and separate connectors for keyboard, video, and pointing device signals at the attachment point to each computer, thus allowing a greater density of connections to computers without modifying the computers being controlled and monitored. Even greater densities may be realized by designating one switch as a master and attaching additional switches to the master.

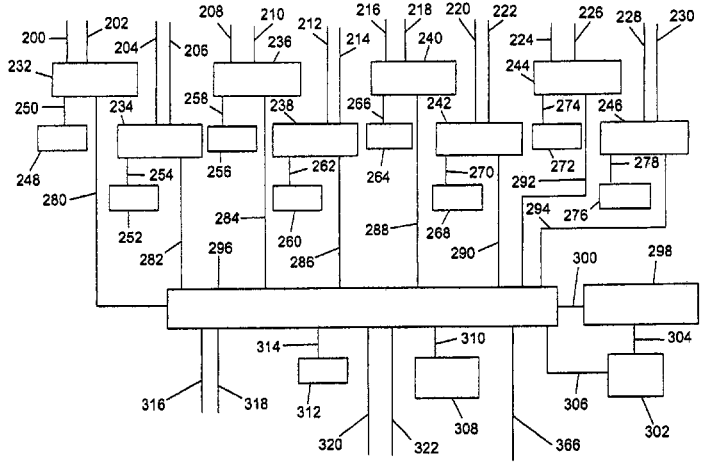

U.S. PATENT DOCUMENTS

| | | | |
|---|---|---|---|
| 6,378,014 | B1 | 4/2002 | Shirley |
| 6,386,120 | B1 | 5/2002 | Nelson et al. |
| 6,388,658 | B1 | 5/2002 | Ahern et al. |
| 6,557,170 | B1 | 4/2003 | Wilder et al. |
| 6,609,034 | B1 | 8/2003 | Behrens et al. |
| 6,618,774 | B1 | 9/2003 | Dickens et al. |
| 6,671,756 | B1 | 12/2003 | Thomas et al. |
| 2001/0000539 | A1 | 4/2001 | Heller et al. |
| 2002/0072892 | A1 | 6/2002 | Shirley |
| 2002/0181199 | A1 | 12/2002 | Bovio et al. |
| 2003/0135656 | A1 | 7/2003 | Schneider et al. |
| 2003/0191878 | A1 | 10/2003 | Shirley |
| 2003/0227929 | A1 | 12/2003 | Ambrose |
| 2004/0015615 | A1 | 1/2004 | Liu |

OTHER PUBLICATIONS

Rose Electronics Jul. 1997 product catalog.
Data sheet for a Tektronix cable, dated Aug. 10, 1992.
Blackbox ServSelect brochure (1997).
Compaq Storage Works product description, (Mar. 25, 2000).
ICS Advent data sheet, (Mar. 25, 2000).
IEI Electronics Inc. manual for the LKM–920, Oct. 1999.
IEI Electronics Inc. Jan. 2000 users manual for LKM–9205.
Web page advertisement for the KLM–9205 dated Jan. 1, 2000.
Advertisement for LKM–9205 (document created Feb. 18, 2000) and cover of Mar. 2000 IEI Product handbook (LKM–9205 on cover).
Mar. 2, 2000 archived Axiomtek web page (1999 copyright).
Datatel Catalog page.
Industrial Computer Catalog page, (1997).
"Raritan Introduces MasterView On–Screen Menu Control for MasterConsole," Businesswire, p. 11290006 (Nov. 29, 1996).
"MasterConsole: A Plug and Play Solution," PR Newswire, p. 1204CL W035 (Dec. 4, 1996).
"Raritan Centralizes Network Server Control," Computers in Libraries, vol. 17, Issue 10, p. 10 (Nov./Dec. 1997).
"Consolidation: System console switches help tame your unruly server racks," James R. Stromski, Network Computing, vol. 9, Issue 4, p. 112 (Mar. 1, 1998).
"MasterConsole MX4" brochure of Raritan.
Advertisement of Diversified Technology in the Sep. 1999 issue of Computer Telephony magazine.
Advertisement of Diversified Technology in the Nov. 1999 issue of Computer Telephony magazine.
EIS Rolls Out Complete UltraSPARC Rackmount Solution for ISPs, Business Wire, Apr. 23, 1999, Gale Group, U.S.
Compaq Server Console Switches (KVM), Mar. 25, 2000, www.compaq.com, U.S.
ICS Advent Rack Mount Drawer with integrated Keyboard and Color LCD Monitor, Mar. 25, 2000, www.icsadvent.com, U.S.
Rariton MasterConsole MX4, www.raritan.com, undated.
Blackrock: Tektronix XP338 Xterminal, Aug. 1999, www.chiark.greened.org.uk/~pmaydell/hardware/blackrock/, U.K.
Email from Lynn Sturgeon to a Google Group, Aug. 10, 1986, U.S.
Tektronix Cable, Intcon: 9FT, 15 Position, Female, D–Sub to (3) BNC x (2) Two Female, 6 Position Mini, Cir Cin, Aug. 10, 1992, Beaverton, OR, U.S.
Erik Cummings, post in Google Groups, www.google.com, Sep. 24, 1997, U.S.
KVM Switches Offer Users Access up to 32 Systems, Computing Canada Apr. 2, 1999, Plesman Publications.
Wallace, John Cybex Computer Products Corp.'s AutoView Commander is reviewed, Computer Reseller News, Jun. 29, 1998, n 796, pp. 86, CMP Publications, U.S.
Cybex Computer Product Corporation Recognized by IDC as a Dominant Player in KVM Switch Market, Business Wire, Jul. 1, 1999, p. 1301, U.S.
Raritan Introduces Master View On–Screen Menu Control for Master Console, Business Wire, Nov. 29, 1996, U.S.
Galleta, David M., Raritan Computer, Dec. 21, 1998, Computer Reseller News, p. 88, U.S.
Slater, Derek, Emerging Technology: Storage Starts to Sizzle, CIO Magazine, Nov. 15, 1997, CXO Media, Inc., U.S.
Stromski, James R., Apex Outlook 180ES KVM Switch has a New Perspective, Network Computing, Mar. 20, 2000, CMP Media, Inc., U.S.
Stromski, James R., Buyer's Guide: Make Room for KVM, Network Computing, Sep. 20, 1999, pp. 108, CMP Media, Inc., U.S.
Network Technologies, Inc.'s NTI Universal KVM Switch ST–8U, CTI Magazine, v 3, n 11, Nov. 1998., U.S.
Sloss, Joel, KVM Switches Roundup, Windows Network & Net Magazine, Jul. 1997, Penton Media, Inc., U.S.
Micronpc.com Offers Industry's Slimmest Internet Server, Business Wire, Jan. 24, 2000, Gale Group, U.S.
Minicom Introduces Revolutionary Supervisor Phantom, first "box free" KVM Switch, Premise Wiring, v 12, n 5, pp. 13, May 1999, U.S.
Fujitsu: Fujitsu Takamisawa Enters KVM Switch Market; Product Supports Multiple Operating Systems, M2 Newswire, Jun. 22, 1999, U.S.
Bass, John, Remote Control Hardware Options, Network World, Mar. 27, 200, vol. 17 issue 13, pp. 53, Network World, Inc., U.S.
Booker, Ellis, Gaining Some Elbow Room—Free Vision System Frees up Server Real State, InterWeek, Aug. 24, 1998, iss. 729, pp. 21, CMP Media, Inc., U.S.
Davey, Tom, Monitor 64 Servers Via One Console, InformationWeek, Jun. 15, 1999, iss. 686, pp. 156, CMP Media, Inc., U.S.
Stromski, James R., Consolidation: System Console Switches Help Tame Your Unruly Server Racks, Network Computing, Mar. 1, 1998, iss. 4 pp. 112, CMP Media, Inc. U.S.
Cybex SwitchView 4–port KVM Switch from Cybex Computer Products Corp., Electronics Now, Jul. 1998, v. 69 n. 7, U.S.
Brodsky, Charles L., Not Your Father's KVM Switch, InternetWeek, May 17, 1999, iss. 765, CMP Media, LLC, U.S.
Rash, Wayne, Enterprise Quality KVM Switches, InternetWeek, Mar. 2, 1998, iss. 704, pp. 52, CMP Media, LLC, U.S.
Raritan Centralizes Network Server Control, Computers in Libraries, Nov./Dec. 1997 v. 17, iss. 10, pp. 10, Raritan Computer, Inc. U.S.
Personal StarView Server Sharer, M2 Presswire, Jan. 2000, M2 Communications, Ltd., Netherlands.
KVM Switch Allows Users to Control up to Four Computers, Computer Dealer News, Dec. 3, 1999, v. 15 iss. 46, pp. 42, Plesman Publications, U.S.

Cybex Announces New AutoView KVM Switch, Business Wire, Aug. 20, 1996, Business Wire, U.S.
Belkin First to Offer a Complete Line of KVM Switches Tested, Certified and Approved for Linux/Unix–Based Computers, Business Wire, Oct. 7, 1999, Gale Group, U.S.
Modules Provide OSD Capability for Switches, Computing Canada, Feb. 26, 1999, Gale Group, U.S.
Cybex Computer Products Corporation Unveils AutoView 200, Advanced Rack–Mountable KVM Switch for Data Centers, Business Wire, May 4, 1999, Gale Group, U.S.
Black Box Corporation Introduces Superior Server–Management KVM Switch, Business Wire, May 3, 1999, Gale Group, U.S.
EIS Rolls Out Complete UltraSPARCC Rackmount Solution for ISPs, Business Wire, Apr. 23, 1999, Gale Group, U.S.
Grigonis, Richard, Fault Resilient Fruit Salad!, Computer Telephony, Oct. 2000, v. 8, n. 10, pp. 66, Gale Group, U.S.
Belkin Components: Belkin Introduces Advanced KVM Switching Products, M2 Presswire, Mar. 17, 2000, M2 Communications, Ltd, U.K.
Cheek, Michael, MasterConsole II's Connects Multiple CPUs to One Monitor, Government Computer News, Apr. 26, 1999, v. 18, n. 11, pp. 34, Gale Group, U.S.
Network Technologies Offers Custom KVM Peripherals, PR Newswire, Jun. 22, 1999, Gale Group, U.S.
Network Technologies' New Universal Matrix KVM Switch Offers Low Cost Flexibility, PR Newswire, May 24, 1999, Gale Group, U.S.
Network Technologies' New Catalog Features KVM Switching Devices & News On Screen Display, PR. Newswire, Apr. 5, 1999, Gale Group, U.S.
Wallace, John, Supplier No. 50124861, Computer Reseller News, Jun. 29, 1998, n. 796, pp. 86, Gale Group, U.S.
Universal Switch Ships with On Screen Display, Computing Canada, Mar. 30, 1998, pp. 33, Gale Group, U.S.
Cybex Expands OEM Customer Base, Business Wire, Jan. 31, 1997, Gale Group, U.S.
Aaritan Computer, Computer Reseller News, Dec. 9, 1996, CMP Publications, Inc., U.S.
Clutter Buster form Cybex, VARbusiness, May 15, 1996, CMP Publications, Inc., U.S.
Startech Computer Products: Personal StarView Server Sharer, M2 Newswire, Jan. 31, 2000, M2 Communications, Ltd. Netherlands.
Images of Compaq KVM system with 8–ports. Not dated.
Internet Archive: Wayback Machine: http://www.archive.org/web/web.php, 8 pages.
Internet Archive: Wayback Machine: Search Results for Jan. 1, 1996–Mar. 16, 2007; http://www.archive.org/web/*/http://www.knurr.com, 8 pages.
User's Manual for Signal Mutliplexer: Signum$^{plus}$ 1HE; http://www.awero.de/support/SUPPORT/DEUTSCH/HANDBUECHER/SIGNUM_PL..., 121 pages.
Rose Electronics Catalog, May 1996, U.S.
Blackbox KVM Cable Pinouts, May 18, 2006, U.S.
Datatel Middle Atlantic Cable Management, www.middleatlantic.com, 1999.
Cables to Go Website Frontpage, www.cablestogo.com, May 22, 2006, U.S.
Wallace, John, Raritan Computer, Computer Reseller News, Dec. 15, 1997, p. 148, U.S.
Rartan's Masterconsole II., Unix Review's Performance Computing, vol. 16, No. 11, p. 71, Oct. 1998, U.S.
Meow Cat5 Reach from Raritan, Computer Telephony, vol. 7, No. 4, p. 54, Apr. 1999, U.S.
Gilliland, Steve, Cybex's Multisystem Control Freak, Computer Shopper, vol. 15, No. 11, p. 646, Nov. 1995, U.S.
Cybex Computer Products Corporation Website Frontpage (from web.archive.org, the "Wayback Machine") www.cybex.com, Dec. 5, 1998, U.S.
Cybex Computer Products Corporation Website Frontpage (from web.archive.org) www.cybex.com/products/, Dec. 2, 1998, U.S.
Cybex Computer Products Corporation Website Product Page(from web.archive.org) for "Auto View Commander", Dec. 5, 1998, U.S.
"Wayback Machine" Listing of Archived Web Pages for www.cybex.com, Apr. 18, 2006, U.S.
Crystal Group, Inc. Press Release on www.crystalpc.com (from web.archive.org), Feb. 10, 1999, U.S.
Crystal Group, Inc. Product Description of Rackmount Computers, Jan. 25, 1999, U.S.
Acme Portable Computers Brochure from the SMAU Show, Oct. 1999, Italy.
Email from Acme Portable Computer Including Prodcut and Price List, Nov. 23, 1999, U.S.
Axiomtek Advertisement (and others) for Rackmount Computers, Computer Telephony Magazine, Oct. 2000, U.S.
Dell Advertisement for PowerEdge Servers, 1999, U.S.
IEI Website Product Listing for LKM–926W Rackmount KVM (from web.archive.org) from www.icpamerica.com, Aug. 31, 2000, U.S.
2 Users Can Access 8 PC's, Computer Telephony, Apr. 1, 1996, U.S.
Kriptec.com web page describing Blackbox.
Cables To Go: DB Connectors web page.

* cited by examiner

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-7 and 16 are cancelled.
Claims 8-15 and 17 were not reexamined.

\* \* \* \* \*